United States Patent
Aso et al.

(10) Patent No.: US 7,408,701 B2
(45) Date of Patent: *Aug. 5, 2008

(54) MULTI-FREQUENCY LIGHT SOURCE

(75) Inventors: Osamu Aso, Tokyo (JP); Shunichi Matushita, Tokyo (JP); Misao Sakano, Tokyo (JP); Masateru Tadakuma, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 153 days.

This patent is subject to a terminal disclaimer.

(21) Appl. No.: 11/407,141

(22) Filed: Apr. 20, 2006

(65) Prior Publication Data

US 2006/0193032 A1 Aug. 31, 2006

Related U.S. Application Data

(60) Division of application No. 10/112,096, filed on Mar. 27, 2002, now Pat. No. 7,054,057, which is a continuation-in-part of application No. 10/053,231, filed on Jan. 17, 2002, now Pat. No. 6,831,775.

(30) Foreign Application Priority Data

Mar. 27, 2001 (JP) ............................. 2001-090324
Mar. 30, 2001 (JP) ............................. 2001-100719

(51) Int. Cl.
*G02F 1/35* (2006.01)
*G02F 1/39* (2006.01)
*H04J 14/02* (2006.01)

(52) U.S. Cl. ...................... 359/326; 359/330; 398/82; 398/92

(58) Field of Classification Search ............... None
See application file for complete search history.

(56) References Cited

U.S. PATENT DOCUMENTS 4,881,790 A 11/1989 Mollenauer ................. 398/180

(Continued)

FOREIGN PATENT DOCUMENTS

| EP | 0 729 057 A2 | 8/1996 |
| EP | 0 859 266 A2 | 8/1998 |
| JP | 2000-183817 | 6/2000 |

OTHER PUBLICATIONS

Shibata et al., "Phase-Mismatch Dependence of Efficiency of Wave Generation Through Four-Wave Mixing in a Single-Mode Optical Fiber", (1997) IEEE Journal of Quantum Electronics, vol. QE-23 No. 7, pp. 1205-1210.

(Continued)

*Primary Examiner*—M. R. Connelly-Cushwa
(74) *Attorney, Agent, or Firm*—Oblon, Spivak, McClelland, Maier & Neustadt, P.C.

(57) ABSTRACT

A multi-frequency light producing method and apparatus multiplies the number of optical channels present in an incident wavelength division multiplexed (WDM) signal light source by four-wave mixing (FWM) the WDM signal with at least one pump lightwave at least one time. By FWM the WDM light and a pump lightwave multiple times, wherein each FWM process is executed with a pump lightwave having a different frequency, either in series or parallel, the number of optical channels produced as a result of FWM effectively increases the number of optical channels present in addition to those from the WDM signal. The light producing method and apparatus can be employed in a telecommunications system as a an inexpensive light source producing a plurality of optical frequencies.

17 Claims, 25 Drawing Sheets

U.S. PATENT DOCUMENTS

| | | | |
|---|---|---|---|
| 5,923,683 A | 7/1999 | Morioka et al. | 372/6 |
| 5,963,567 A | 10/1999 | Veselka et al. | 372/21 |
| 6,324,318 B1 | 11/2001 | Suzuki | 385/24 |
| 6,529,314 B1 | 3/2003 | Shukunami et al. | 359/332 |
| 6,831,775 B2 | 12/2004 | Matsushita et al. | 359/326 |
| 7,054,057 B2 * | 5/2006 | Aso et al. | 359/326 |
| 2001/0007509 A1 | 7/2001 | Aso et al. | 359/326 |

OTHER PUBLICATIONS

Watanabe et al., "Interband Wavelength Conversion of 320 Gb/s (32X10 Gb/s) WDM Signal Using a Polarization-Intensive Fiber Four-Wave Mixer", (1998) ECOC '98 Madrid Spain, pp. 85 and 87.

Aso et al., "Broadband Four-Wave Mixing Generation in Short Optical Fibers", (2000) Electronic Letters vol. 36, No. 8, pp. 709-711.

T. Tomooka et al., The Generation of Powerful Rainbow-Color Laser Emission by Four-Wave Raman Mixing Display and Illumination, (1998) Journal of the Illuminating Engineering Institute of Japan, vol. 22, No. 2, pp. 1-5.

Ch. Koch et al., "Bridging THz-Frequency Gaps in the Near IR by Coherent Four-Wave Mixing in GaAlAs Laser Diodes", (1992) Optic Communications North-Holland Publishing Co., vol. 91, No. 5/6, pp. 371-376.

* cited by examiner

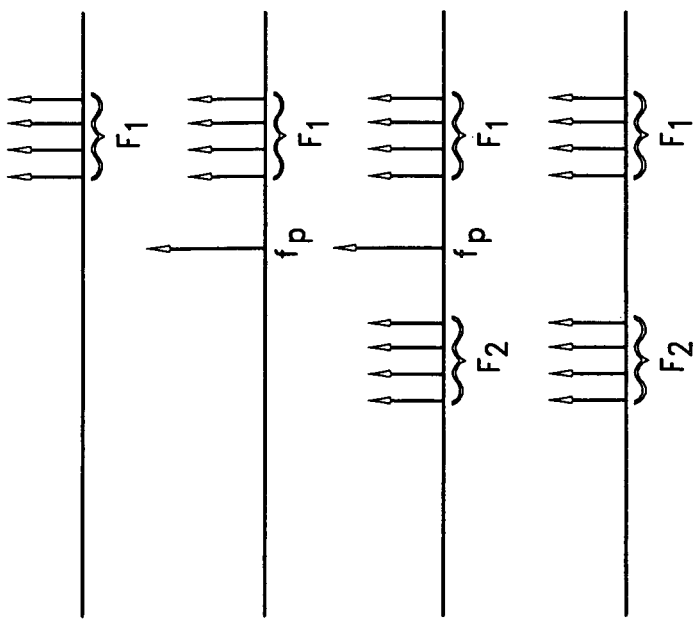
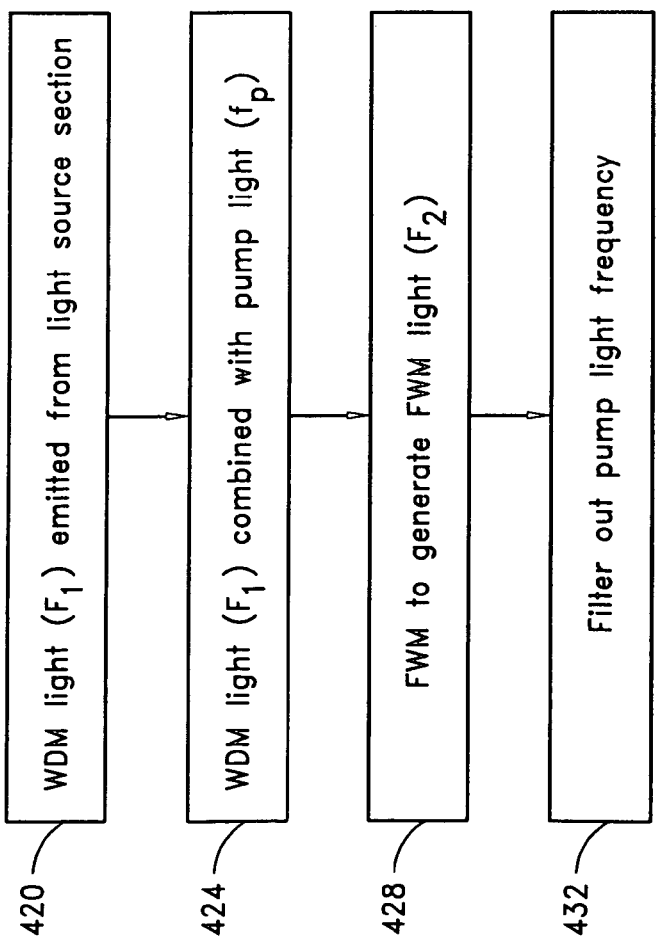
FIG. 6

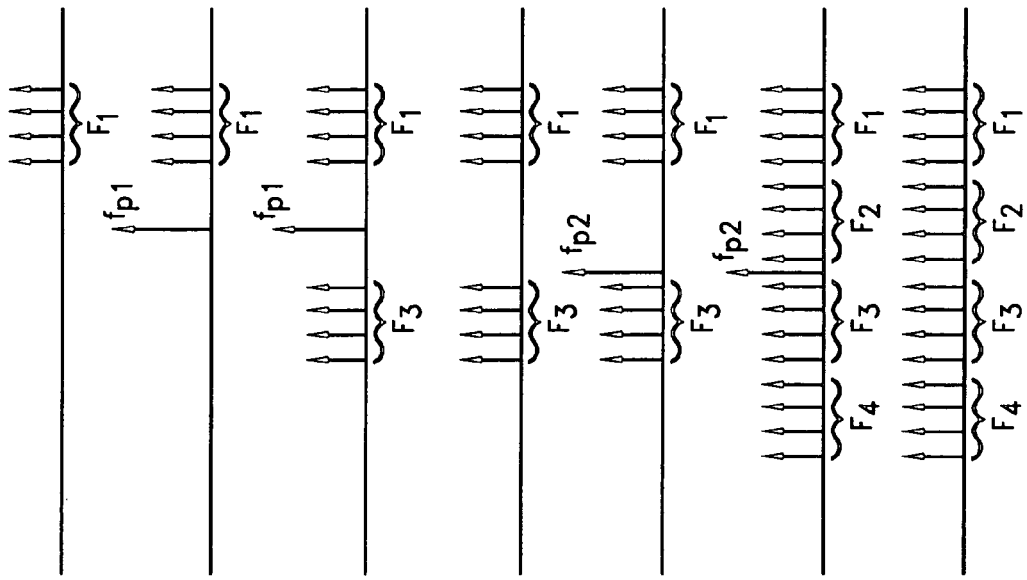
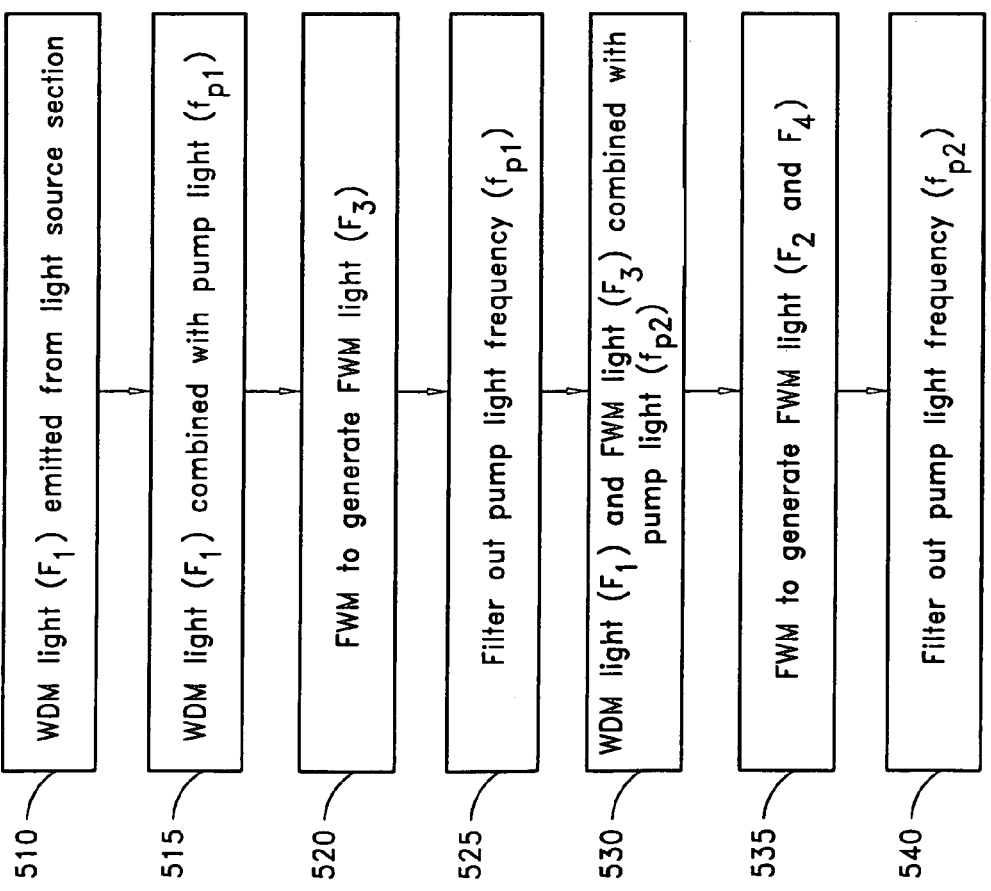
FIG. 9

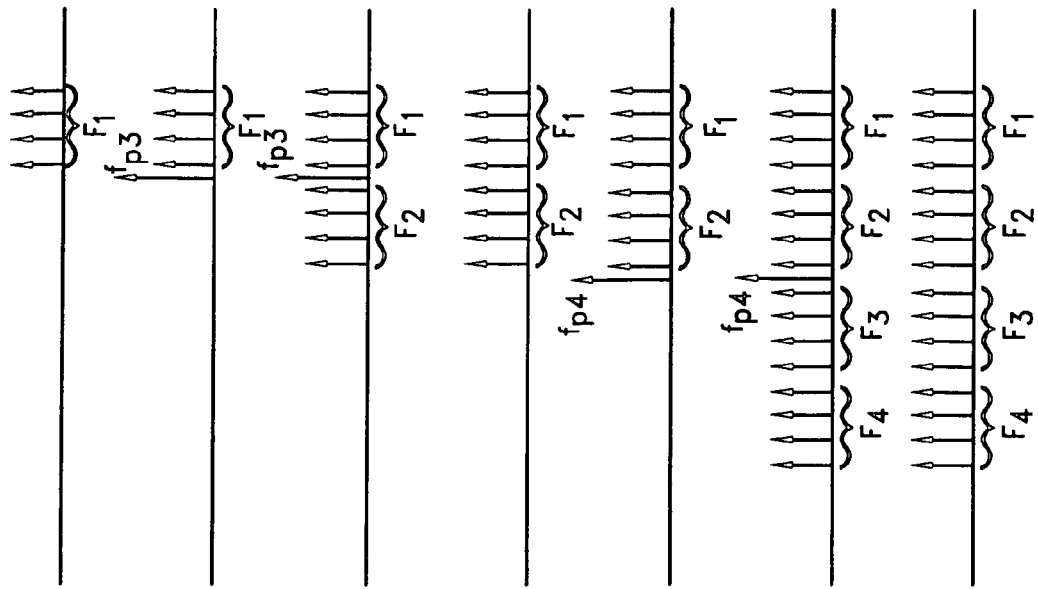
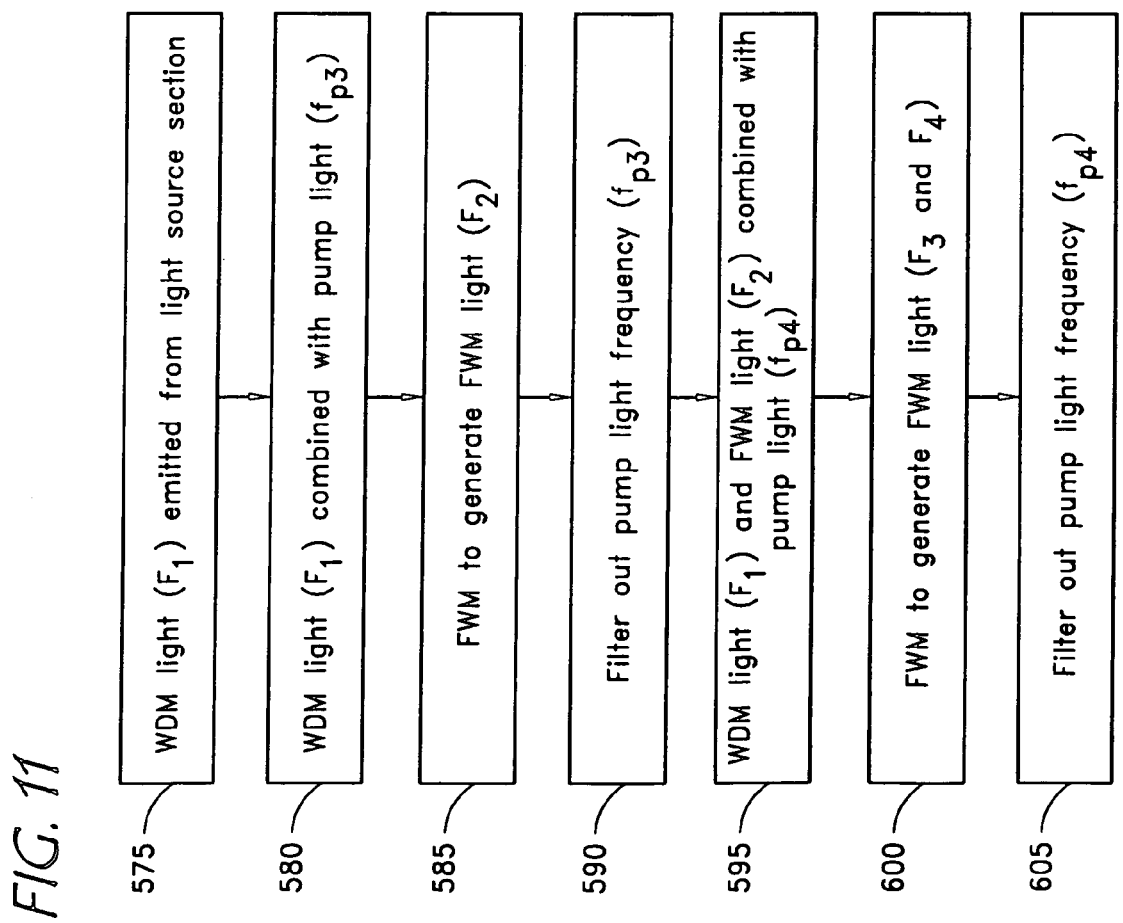
FIG. 11

MULTI-FREQUENCY LIGHT SOURCE

CROSS REFERENCE TO RELATED APPLICATION

This application is a continuation-in-part of U.S. patent application Ser. No. 10/053,231 entitled "METHOD AND APPARATUS FOR WAVELENGTH CONVERSION" filed on Jan. 17, 2002 now U.S. Pat. No. 6,831,775. The disclosure of the above-described filed application is hereby incorporated by reference in its entirety.

BACKGROUND OF THE INVENTION

Description of the Related Art

WDM optical signals are commonly used in optical telecommunications systems as a way to simultaneously transmit a plurality of optical signals over an optical transmission line to a receiver. Each optical wavelength channel in the WDM signal is typically generated by a laser diode as a continuous wave light source at a transmitter, the optical channels are then modulated, multiplexed, and transmitted over the transmission line. For a system employing a large number of wavelengths, using a different light source such as a laser diode to generate each optical wavelength can be expensive and consume a large amount of electric power.

To avoid using so many laser light sources, four-wave mixing (FWM) generated from a smaller number of continuous wave light sources with a pump source has been proposed as a way of multiplying the number of lightwaves available from a smaller number of laser sources. When employing FWM for this purpose, it is desirable to maximize the number of output lightwaves relative to the number of input signal. This can be done by increasing the intensity of the input WDM lightwaves relative to the pump light, which increases the channels of the "higher order" signals produced by the four wave mixing process such that they can be used as additional frequency outputs. This higher-order FWM phenomenon is well known and is described in Japanese Patent Number JP3199106, and "Phase-Mismatch Dependence of Efficiency of Wave Generation Through Four-Wave Mixing in a Single-Mode Optical Fiber" by Shibata et al. IEEE Journal of Quantum Electronics, Vol. QE-23, No. 7, July 1987, pp. 1205-1210, which is hereby incorporated by reference in its entirety. However, the lightwaves generated in the four-wave mixing process are still not all of equal intensity, and thus the output powers of the different channels may vary in and undesirable manner.

SUMMARY OF THE INVENTION

In one embodiment, the invention comprises a method of generating continuous lightwaves having a plurality of frequencies for telecommunication transmission. The method comprises proper four-wave mixing generated by multi-frequency continuous lightwaves with a pump in a nonlinear medium so as to provide WDM lightwaves having more WDM channels than the WDM lightwaves input to the nonlinear medium.

A variety of specific embodiments are provided and described. In one embodiment, a method comprises four-wave mixing generated by the continuous WDM lightwaves and a pump in a nonlinear medium In another embodiment, a telecommunications system comprises a continuous lightwave source utilizing proper four-wave mixing so as to provide a plurality of optical channels, a plurality of modulators, coupled to the continuous lightwave source and configured to modulate the plurality of optical channels, a multiplexer, coupled to the plurality of modulators and configured to multiplex a plurality of modulated optical channels, and optical transmission line, coupled to the multiplexer, and a receiver, coupled to the transmission line and configured to receive the multiplexed optical channels. The light source of the telecommunications system may further comprise a plurality of four-wave mixers connected in parallel or series, configured to provide the plurality of optical channels.

In another embodiment, an optical channel multiplication device comprises a plurality of four-wave mixers, optically coupled in series, and configured to emit at least twice as many optical channels provided by a continuous wave optical signal.

In another embodiment of the invention, a multi-frequency light source comprises N light sources, a multiplexer having the N light sources as an input and a multiplexed output, and K four-wave mixers. The K four-wave mixers can be connected in series and the output of the K four-wave mixers can have $N \times 2^K$ optical channels. Alternately, the K four-wave mixers can be connected in parallel and the combined output of the K four-wave mixers can have $N \times (K+1)$ optical channels.

BRIEF DESCRIPTION OF THE DRAWINGS

FIG. 6 is a flow chart illustrating a method of operation of the multi-frequency light source of FIG. 5.

FIG. 9 is a flow chart illustrating a method of operation of the multi-frequency light source of FIG. 8.

FIG. 11 is a flow chart illustrating a method of operation of the multi-frequency light source of FIG. 10.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Systems implementing the methods described herein may, for example, route a multiplexed optical signal comprising multiple channels and an additional optical signal to a medium having nonlinear optical characteristics so as to generate a plurality of optical channels in addition to those provided by the multiplexed optical signal. Such a method can be executed a number of times, either in a series or a parallel format, such that the effective number of optical channels produced by the method is greater than the number of channels provided by the multiplexed optical signal. In addition, a variety of optical elements can be implemented to perform these functions as well as manipulating polarization states of the optical signals. In the present description, the terms "lightwave," "optical signal," and "light" are used somewhat interchangeably to all describe light in the form of a wave, capable of comprising a plurality of optical channels at a plurality of frequencies or wavelengths.

Four-wave mixing (FWM) is a phenomenon wherein three optical lightwaves of different frequencies (wavelengths), propagating in a nonlinear medium interact with one another due to the nonlinear optical effect of the conversion medium. This interaction generates additional optical signal having different frequencies from the three original signals.

The basic principle of FWM-based wavelength (or frequency) conversion can be described as follows. Given three optical lightwaves having frequencies $\omega_1$, $\omega_2$, and $\omega_3$, respectively, propagating in a conversion medium, and the frequency of the signal generated by FWM is given by $\omega_c$, the following equation is satisfied:

$$\omega_c = \omega_1 + \omega_2 - \omega_3 \quad \omega_2 \neq \omega_3 \quad (1)$$

Figure 1:
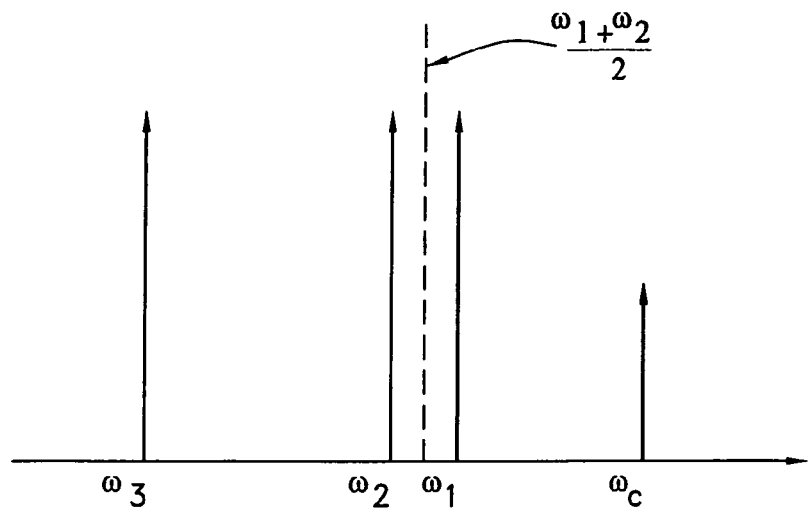
FIG. 1 is an exemplary graphical illustration of the basic principle of FWM-based wavelength conversion.

The frequency $\omega_c$ of the generated (wavelength converted) signal appears at a location symmetric to the frequency $\omega_3$ mirrored about the average frequency $(((\omega_1+\omega_2)/2)$ of the other two signals $\omega_1$, $\omega_2$, as illustrated in FIG. 1.

Given that $\omega_p$ is the frequency of the FWM-originating pump lightwave, and $\omega_s$ is the frequency of the signal lightwave, and letting $\omega_1 = \omega_2 = \omega_p$ and $\omega_3 = \omega_S$ in equation (1), the following equation is satisfied:

$$\omega_c = 2\omega_p - \omega_s \quad (2)$$

Figure 2:
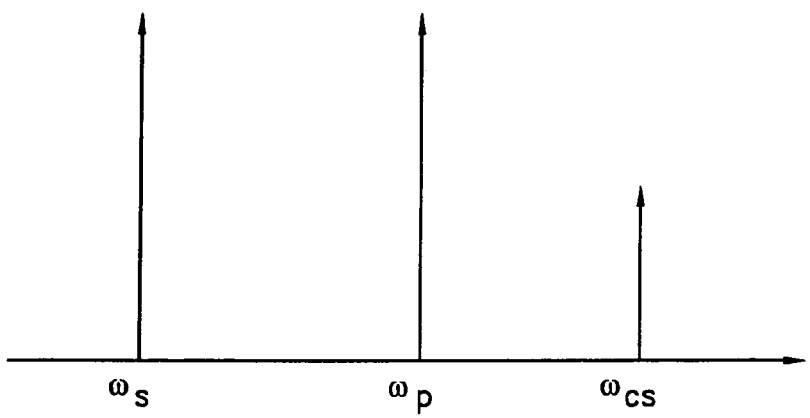
FIG. 2 is an exemplary graphical illustration of degenerate FWM phenomenon.

This FWM phenomenon is referred to as degenerate FWM phenomenon, wherein the wavelength converted signal $\omega_{cs}$ appears on the frequency axis at a position symmetric to the frequency $\omega_S$ of the signal lightwave, mirrored about the frequency $\omega_p$ of the pump light as shown in FIG. 2.

In the event the signal light is a WDM signal consisting of multiple (n) channels and subjected to simultaneous wavelength conversion by FWM, the following problem arises. The WDM signal is subjected to simultaneous wavelength conversion as expressed by equation (2). At the same time, however, a high-order FWM phenomenon occurs between pairs of components of the WDM signal (multiple channels) and the pump lightwave, having the frequency $\omega_p$, which produces a wavelength converted signal based on the high-order FWM phenomenon.

The mode of generation of these high order (also referred to herein as "improper") signals is considered as follows. Assume the frequency $\omega_p$ of the pump lightwave is off the frequency band of the WDM signal light before wavelength conversion, and the frequencies of the WDM signal light are "$\omega_{s1}$" "$\omega_{s2}$" and so forth, in order from the frequency closest to the frequency $\omega_p$ of the pump lightwave, wherein the i-th channel frequency is $\omega_{si}$ and the j-th channel frequency is $\omega_{sj}$. Furthermore, let $\omega_{nij}$ be the frequency of a high order signal generated by FWM. The following equation can now be satisfied.

$$\omega_{nij} = \omega_p + \omega_{si} - \omega_{sj} \quad (3)$$

The frequency of the high order signal that is generated at the position closest to the frequency $\omega_p$ of the pump lightwave is determined by the two channels (whose frequencies are $\omega_{sj}$ and $\omega_{si}$, respectively) among the channels of the WDM signal prior to wavelength conversion which have the minimum frequency interval. Therefore, the frequencies of high order signals ($\omega_{n1}$ and $\omega_{n-1}$) generated by high-order FWM of the two channels and the pump lightwave are the closest to the frequency $\omega_P$ of the pump lightwave.

Figure 3:
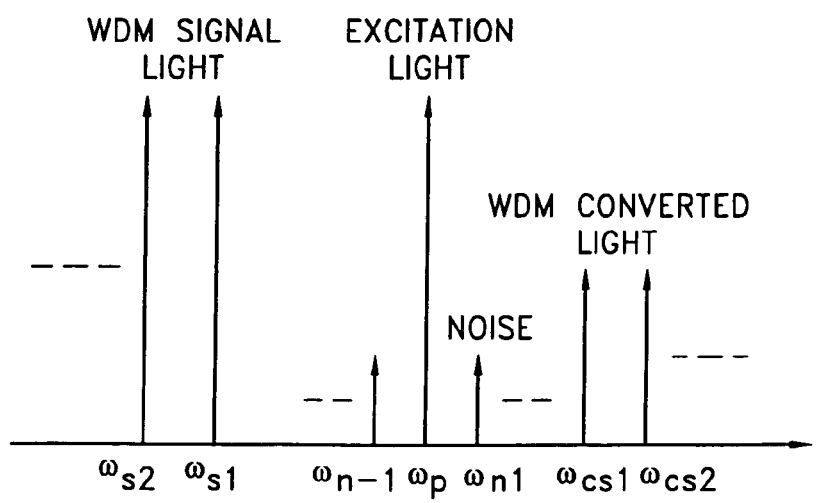
FIG. 3 is an exemplary graphical illustration of FWM of a WDM signal with a pump lightwave.

FIG. 3 illustrates the position on the frequency axis of the WDM converted signals produced by FWM with respect to the channel frequencies $\omega_{s1}$ and $\omega_{s2}$ of the WDM signal, and high order signals generated by high-order FWM between $\omega_{si}$ and $\omega_{sj}$. As shown, the WDM signals of channel frequencies $\omega_{s1}$ and $\omega_{s2}$ are produced as converted signals of frequencies $\omega_{c1}$ and $\omega_{c2}$ at symmetric positions mirrored about the frequency position $\omega_p$ of the pump lightwave. The high order signals at frequencies $\omega_{n1}$ and $\omega_{n-1}$ are produced at the positions closest to the frequency $\omega_p$ of the pump lightwave.

The present invention utilizes only the proper FWM light to realize a multi-frequency light source, rather than high-order, improper FWM light, which will be discussed in further detail hereinafter. As a result, the multi-frequency light source of the present invention provides optical signals with exceptional frequency spectrum flatness.

If FWM is induced multiple times, wherein the frequency band of the FWM generated light is different from the frequency of the probe light (incident light to undergo FWM with a pump light, WDM light in this case), the number of optical channels generated in response to the WDM light can be successively increased. Thus, the number of optical channels of the incident WDM light is multiplied to realize the multi-channel light source. Multiple embodiments of a multi-frequency light source are described in more detail below.

One embodiment of the invention implementing the phenomenon described above is illustrated in FIG. 4. In this embodiment, a plurality of light sources such as laser diodes 360 have outputs that are multiplexed together by a multiplexer 362. The output of the multiplexer is routed to a four-wave mixer 364 and pump source filter/filters 370 connected in series. 2N or more outputs may be generated as described below, depending on the configuration of the converter 364. The filter 370 advantageously filters out the FWM pump light, but not the original signal light nor the signals produced by proper four wave mixing. If desired, the outputs may be demultiplexed into separate light sources by a demultiplexer 372.

Figure 4:
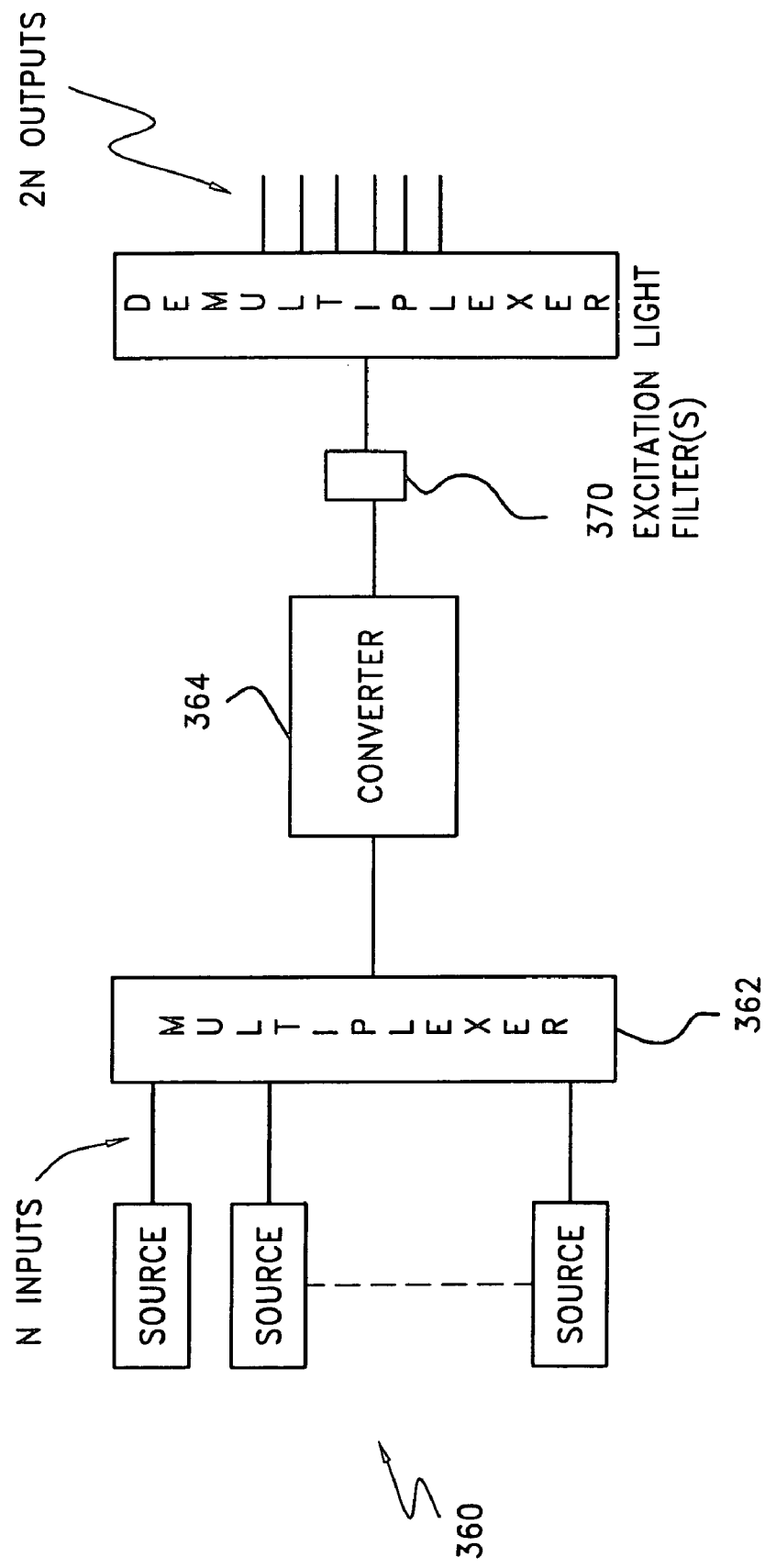
FIG. 4 is a block diagram of a multi-frequency light source according to one embodiment of the invention.

As described above, it is preferable if none of the outputs comprise high order FWM signals. In some embodiments, the pump light is at least 10 times higher in intensity than the original signal light in order to reduce the amplitude of the high order signals relative to the proper FWM signals. It is especially advantageous for the pump to be at least 100 times higher intensity than the input signals. In some embodiments, the FWM process is controlled such that the high order signals are removed without removing the proper FWM mixing signals. FIG. 4 is one example of this type of light source embodiment.

The light source of the invention can be implemented in an optical telecommunications system wherein a continuous lightwave from a light source is multiplexed at an optical transmitter, and transmitted over a transmission line to a receiver. Using the systems and methods presented herein, a minimal number of continuous lightwave sources can be implemented in a transmitter of a telecommunications system to provide multiple continuous wave optical frequencies or channels for communication over a transmission line to a receiver.

Figure 5:
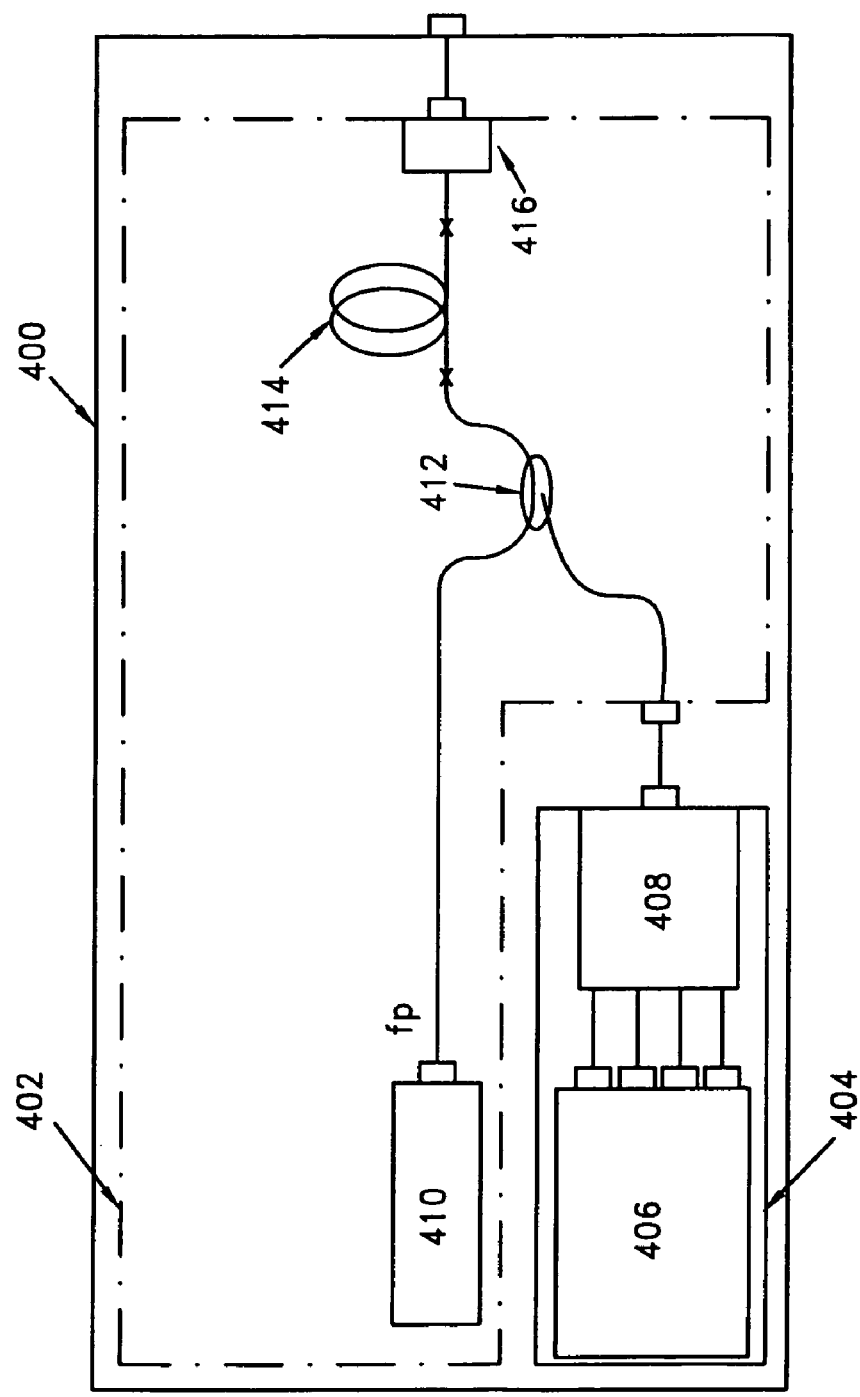
FIG. 5 is a block diagram of one embodiment of a multi-frequency light source.

FIG. 5 is a block diagram of one embodiment of a multi-frequency light source 400. The multi-frequency light source 400 comprises a plurality of elements which may be optically connected in series as shown in FIG. 5, but which may be combined or joined in other ways, some examples of which are provided further below. The elements of the multi-frequency light source 400 of FIG. 5 comprise a WDM light source section 404 optically connected in series with an optical multiplexing section 402.

The light source section 404 comprises a continuous lightwave source 406 and an optical multiplexing section 408. The continuous lightwave source 406 can be constructed by collecting a plurality of continuous lightwave sources, such as laser diodes, having different oscillation frequencies. The optical multiplexing section 408 can be configured to combine a plurality of continuous lightwaves, employing, for example, an arrayed waveguide grating (AWG). The lights from the continuous lightwave source 406 are combined in the optical multiplexing section 408 to produce a combined light. The combined light can have a single optical channel, or can be WDM light having a plurality of optical channels.

The optical multiplexing section 402 advantageously includes a four-wave mixer comprising a pump source 410, an optical combining section 412, a nonlinear medium 414, and an optical filter 416. The pump source 410 can be configured to emit pump light having a frequency $f_p$. The optical combining section 412 can combine the pump light emitted from the pump source 410 with incident light from the optical multiplexing section 408 of the light source section 404, and can be implemented, for example, with an optical coupler.

The optical combining section 412 provides the combined light to the nonlinear medium 414, where four-wave mixing can be induced.

The nonlinear medium 414 can be implemented as, for example, an optical fiber, such as a highly nonlinear dispersion shifted fiber (HNL-DSF), or a semiconductor optical amplifier, and the nonlinear medium 414 described herein is more particularly an optical fiber. The nonlinear medium 414 is optically coupled to the optical filter 416, which can be, for example, a band pass or suppression filter, or group of filters, for removing the pump light ($f_p$) from the light produced by the nonlinear medium 414, such that the light emitted from the multi-frequency light source 400 comprises the WDM light and the FWM light.

A multi-frequency light source generation method implemented with the device of FIG. 5 is illustrated in the flow diagram of FIG. 6. Referring to FIGS. 5 and 6, WDM light, having a frequency band $F_1$, is emitted from the light source section 404 in a step 420 and combined in the optical combining section 412 with the pump light having the frequency $f_p$ in a step 424. In a step 428, the combined light is then made incident to the nonlinear medium 414, wherein FWM interaction generates FWM light having a frequency band $F_2$. As can be seen in FIG. 6, the frequency band ($F_2$) of the FWM generated light is symmetric with respect to the WDM light frequency band ($F_1$), as centered about the frequency ($f_p$) of the pump light. The pump light ($f_p$) can subsequently be removed from the frequency band in a step 432 with the optical filter 416, such that only the WDM light ($F_1$) and the FWM light ($F_2$) remain in the frequency band. More specifically, in the event a single four-wave mixer utilizing proper FWM is implemented, the number of optical channels in the light emitted from the light source will be twice the number of optical channels present in the WDM light.

The frequency of the pump light can be altered so as to generate FWM light having a different frequency band than that of the probe light. For efficient generation of FWM, it is preferable that the nonlinear medium have a zero dispersion frequency ($f_0$) which corresponds to a frequency of the pump light, or average of pump light frequencies, as previously discussed.

Figure 7:
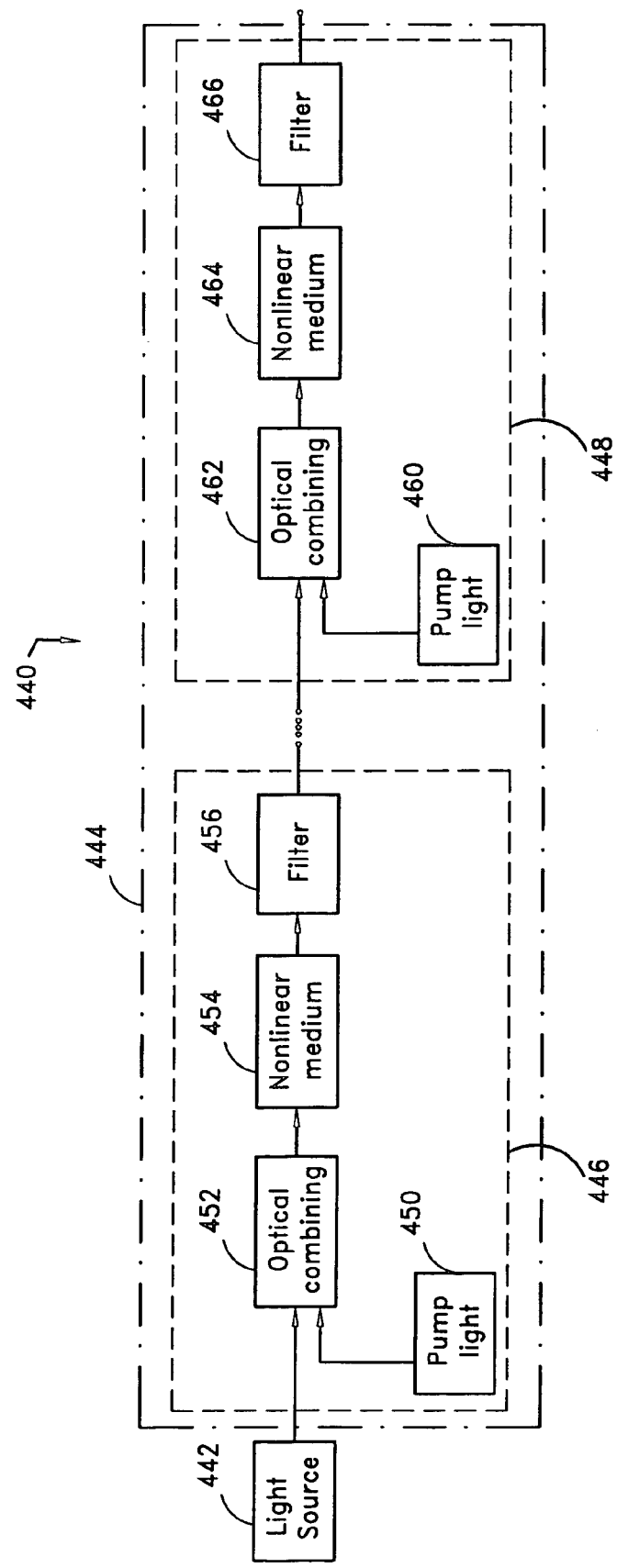
FIG. 7 is a block diagram of one embodiment of a multi-frequency light source.

Connecting a plurality of four-wave mixers in parallel or series can effectively increase the number of channels produced by a light source of the invention. FIG. 7 is a block diagram illustrating a multi-frequency light source 440 comprising a multiplexed light source 442 coupled to a multiplying section 444. The multiplexed light source 442 can be similar to the light source section 404, wherein a continuous lightwave can be multiplexed, and the multiplying section 444 can comprise a plurality of four-wave mixers optically coupled in series.

The multiplying section 444 can have N four-wave mixers coupled in series, wherein a first four-wave mixer 446 comprises a pump light source 450, a light combining section 452, a nonlinear medium 454, and a filter 456, coupled in series. Similarly, an N-th four-wave mixer can comprise a pump light source 460, a light combining section 462, a nonlinear medium 464, and a filter 466, coupled in series.

In the first four-wave mixer 446, the optical combining section 452 can be configured to combine pump light emitted from the pump light source 450 and multiplexed optical channels from the multiplexed light source 442. The combined light from the optical combining section 452 can then be routed to the nonlinear medium 454 where FWM can be induced by the nonlinear properties of the medium 454. The pump light can then be filtered out of the light emitted from the nonlinear medium 454 with the optical filter 456, similar to the four-wave mixer 400.

The output of the filter 456 can be coupled to an optical combining section of a subsequent four-wave mixer in series with the first four-wave mixer 446, up to the N-th four-wave mixer 448. In the N-th four-wave mixer 448, the optical combining section 462 can be configured to combine pump light emitted from the pump light source 460 and multiplexed optical channels from the previous four-wave mixers, such as the first four-wave mixer 446. The combined light from the optical combining section 462 can then be routed to the nonlinear medium 464 where FWM can be induced by the nonlinear properties of the medium 464. The pump light can then be filtered out of the light emitted from the nonlinear medium 464 with the optical filter 466, similar to the four-wave mixer 400.

The frequencies of each of the pump lights and the zero dispersion frequency of each of the optical fibers implementing a nonlinear medium can be adjusted so as to efficiently induce FWM without overlap of the generated frequency band and the probe light frequency band. As a result, light emitted from the plurality of four-wave mixers has a larger number of optical channels than the incident WDM light.

In the case where N four-wave mixers are coupled in series such that FWM occurs N times, WDM light having n channels can be emitted from the light source section and made incident to the first four-wave mixer 446. The optical phenomenon which occurs in each of the N four-wave mixers is similar to that in the four-wave mixer of FIG. 5. As a result, the WDM light emitted from the light source 440 having N four-wave mixers coupled in series can have $n \times 2^N$ optical channels. A light source having N four-wave mixers coupled in series so as to produce more optical channels than are present in the incident WDM light is contemplated by the invention.

Figure 8:
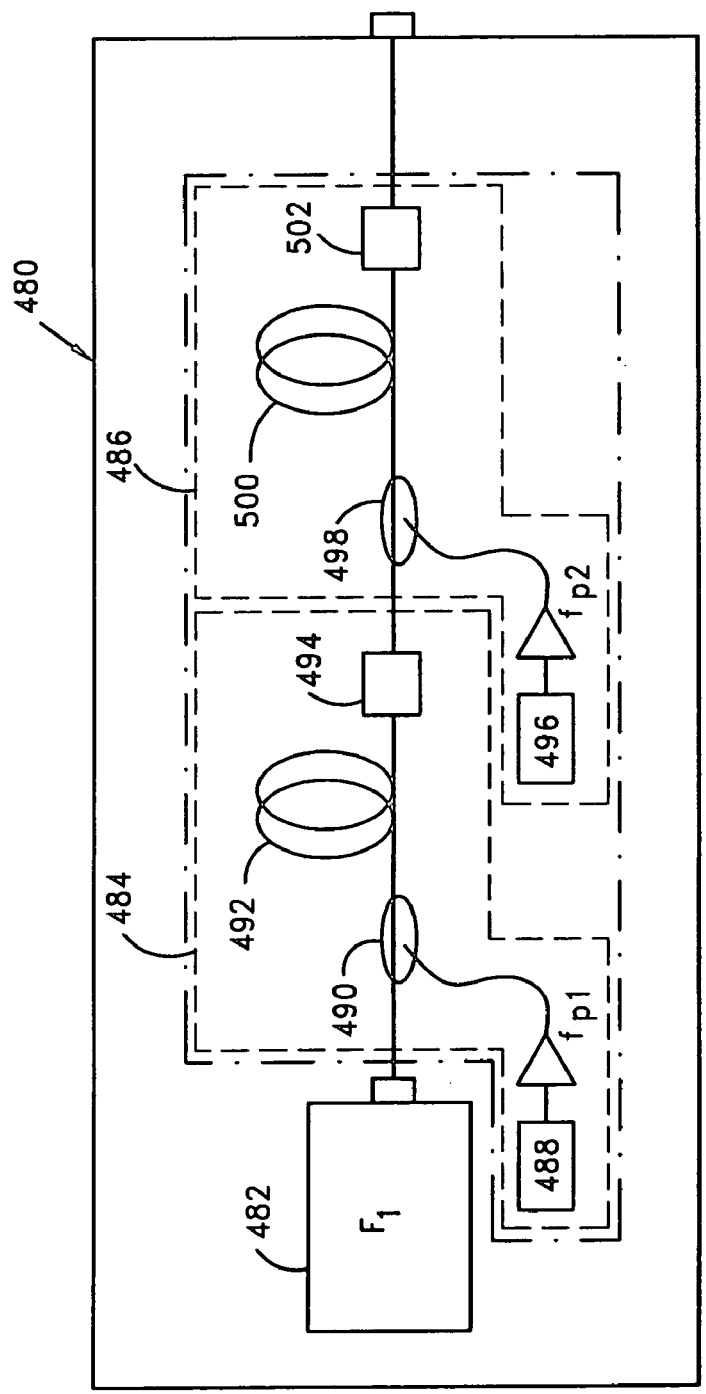
FIG. 8 is a block diagram of one embodiment of a multi-frequency light source.

FIG. 8 illustrates one embodiment of a multiple frequency light source 480, implementing a structure similar to that described with respect to FIG. 7. The light source 480 comprises a light source section 482, similar to the light source section 404, and two four-wave mixers 484, 486, similar to the four-wave mixer 402, optically coupled in series.

The first four-wave mixer 484 comprises a pump light source 488, an optical combining section 490, a nonlinear medium 492 implemented with an optical fiber, and an optical filter 494. The frequency ($f_{p1}$) of pump light produced by the pump light source 488 can be near the zero dispersion frequency ($f_o$) of the optical fiber 492, and the optical filter 494 can be configured to filter out, or suppress the pump light frequency ($f_{p1}$).

The second four-wave mixer 486 comprises a pump light source 496, an optical combining section 498, a nonlinear medium 500 implemented with an optical fiber, and an optical filter 502. The frequency ($f_{p2}$) of pump light produced by the pump light source 496 can be near the zero dispersion frequency ($f_o$) of the optical fiber 500 and the optical filter 494 can be configured to filter out, or suppress the pump light frequency ($f_{p2}$).

Figure 13:
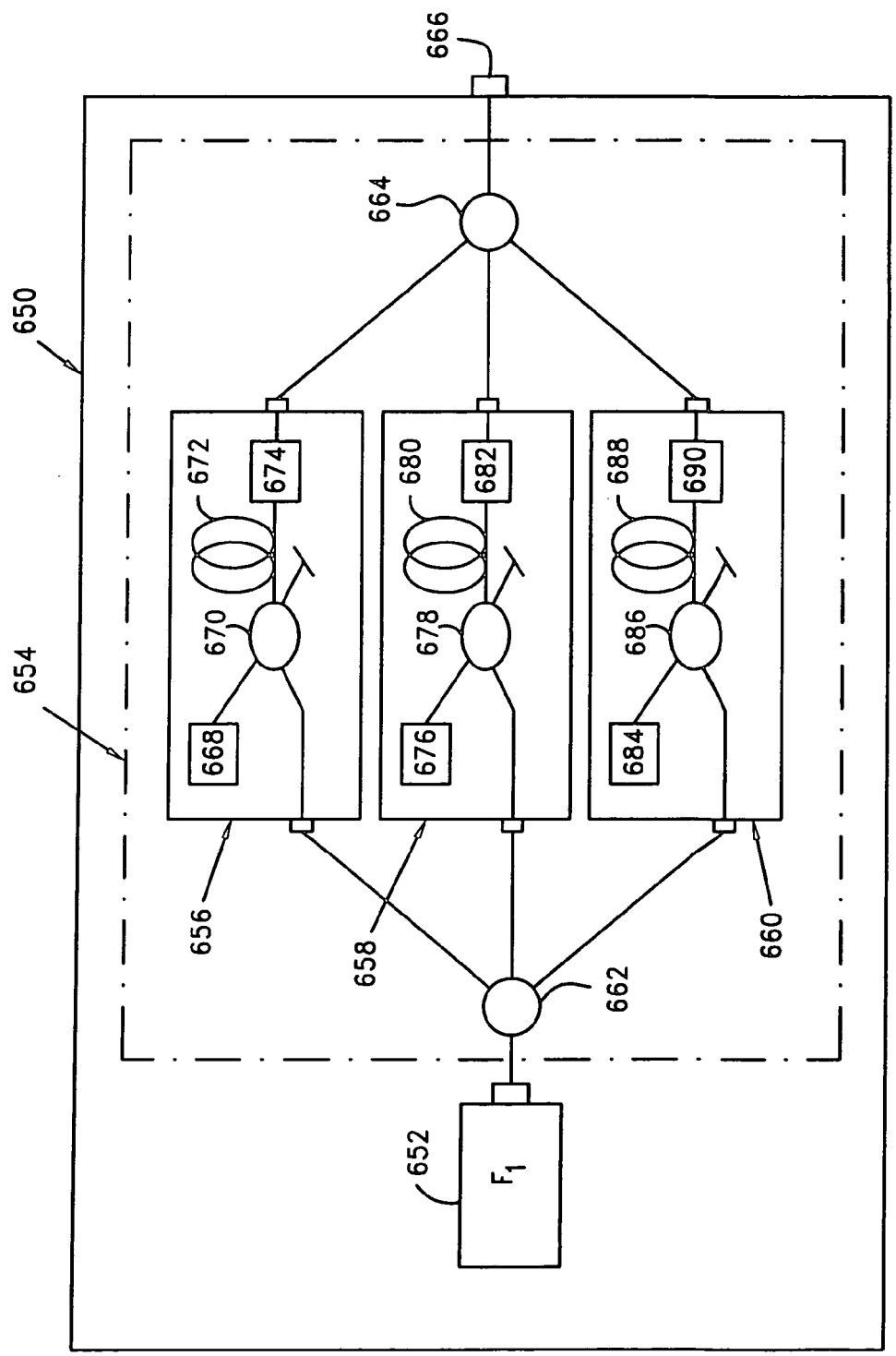
FIG. 13 is a block diagram of one embodiment of a multi-frequency light source.
Figure 14:
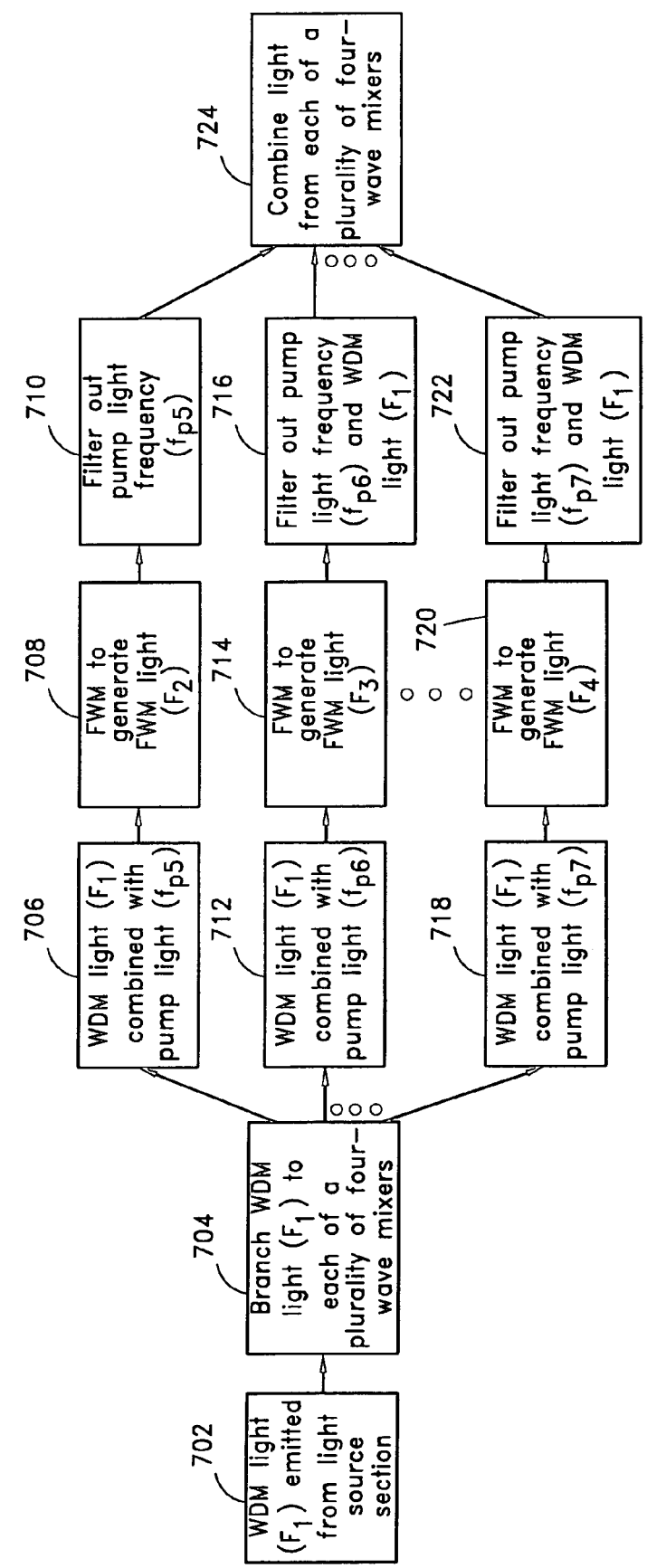
FIG. 14 a flow chart illustrating a method of operation of the multi-frequency light source of FIG. 13.
Figure 15:
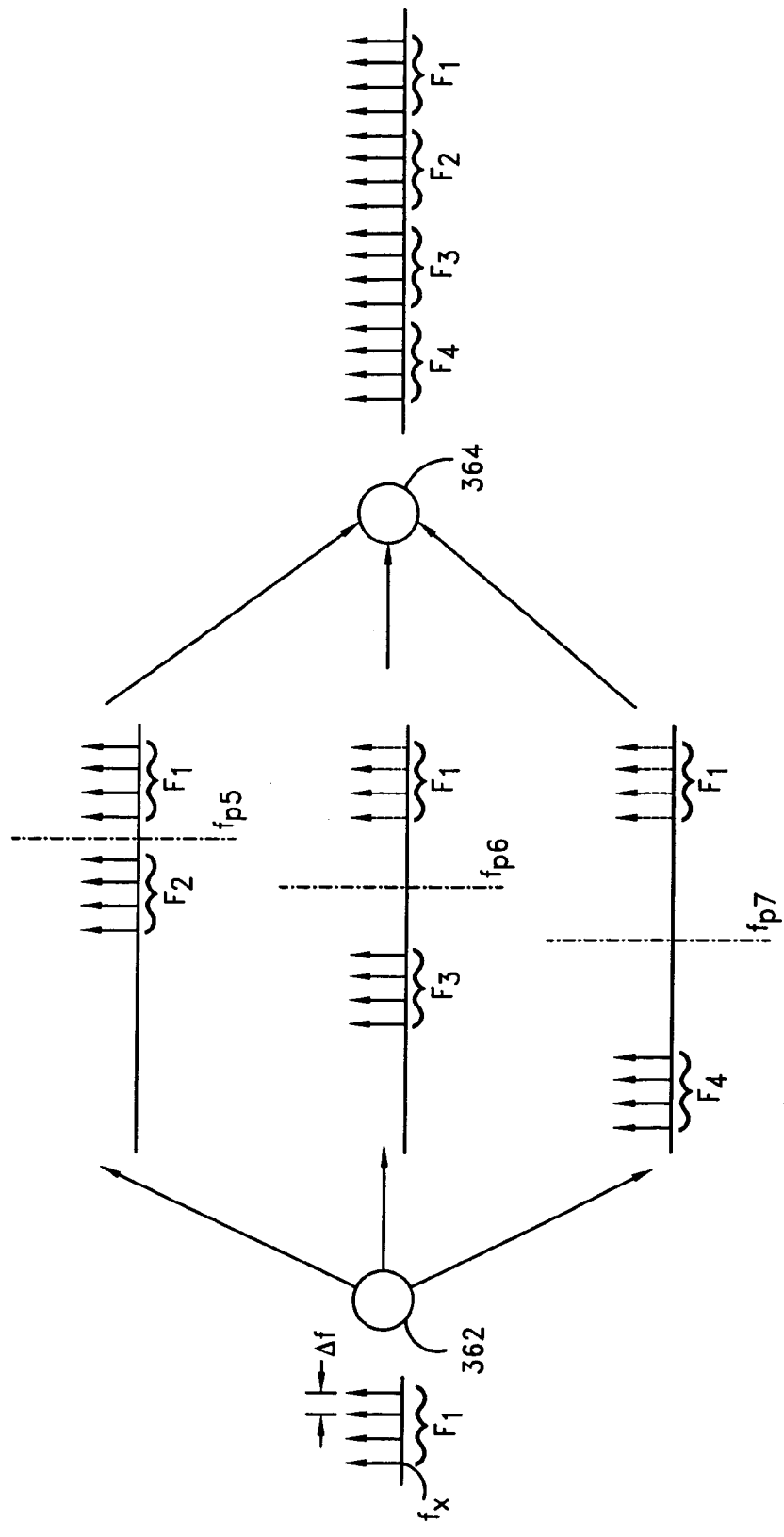
FIG. 15 is frequency band flow chart illustrating the operation of the multi-frequency light source of FIG. 13.
Figure 16:
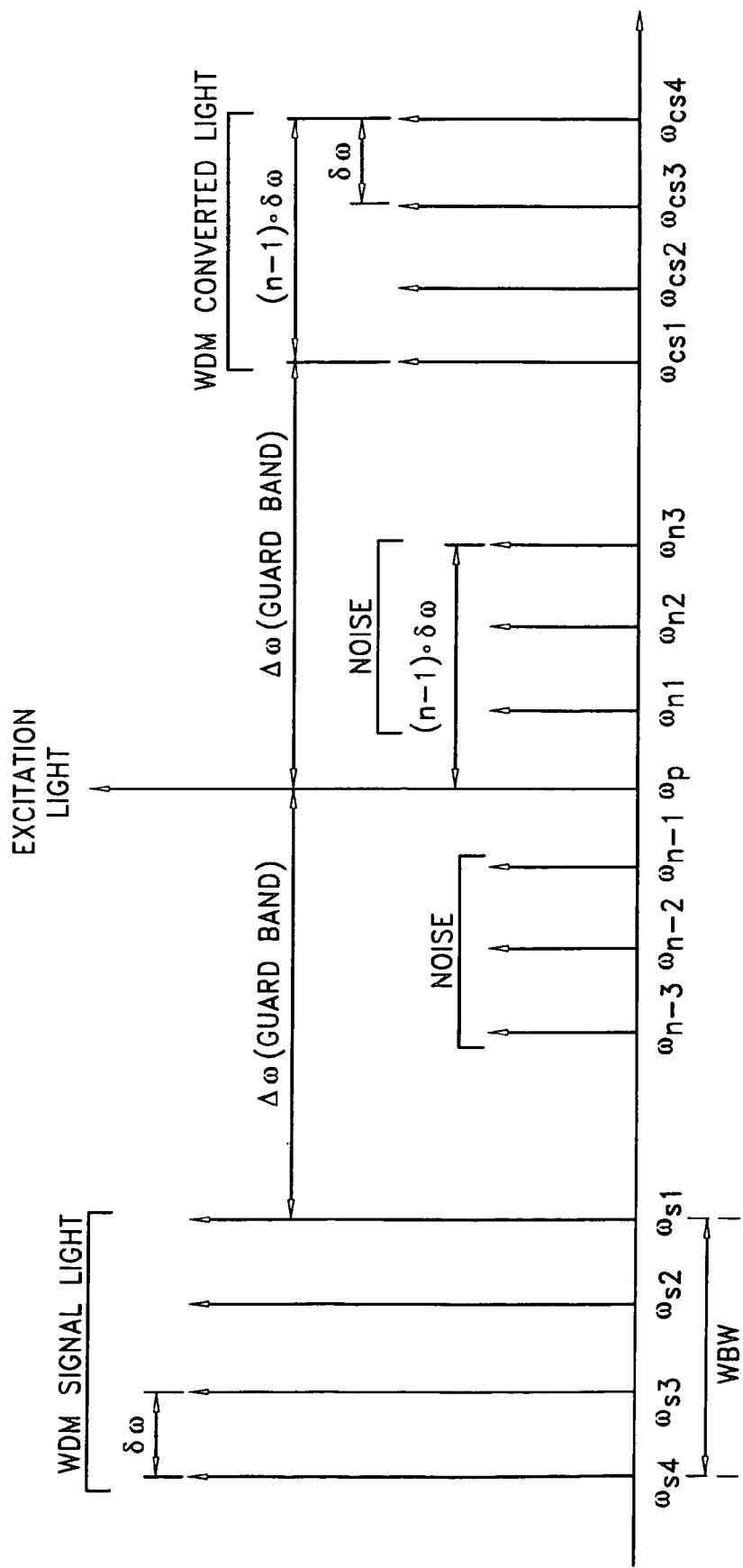
FIG. 16 is an exemplary graphical illustration of FWM of a WDM signal according to a first method of wavelength conversion.
Figure 17:
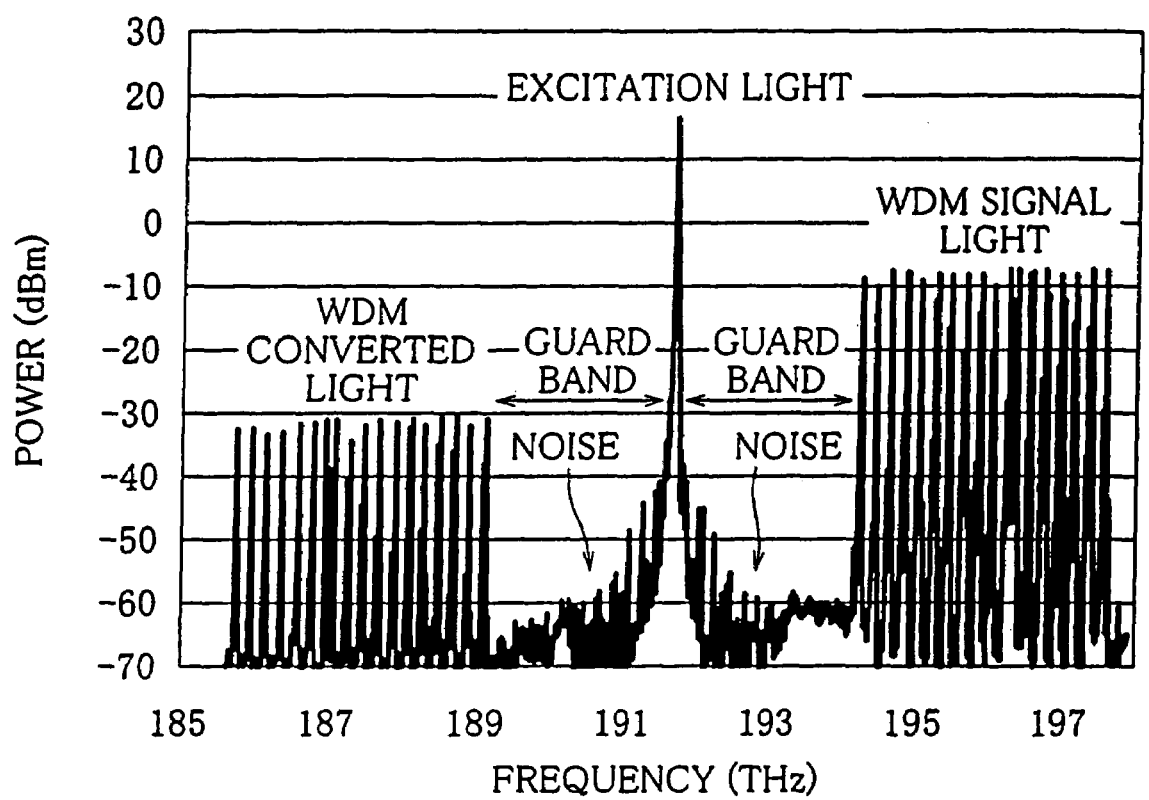
FIG. 17 is an optical spectrum illustrating wavelength conversion according to a first embodiment of a wavelength converter.

A multi-frequency light source generation method implemented with the device of FIG. 8 is illustrated in the flow diagram of FIG. 9. Referring to FIGS. 13 and 14, incident WDM light, comprising optical channels of a continuous lightwave in the frequency band $F_1$, is emitted from the light source 482 in a step 510, and, in a step 515, the WDM light is combined with pump light ($f_{p1}$) in the optical combining section 490. The frequency band of the incident WDM light can be referred to as $F_1$ having a bandwidth W and, for example, four optical channels, as shown in FIG. 9. Next, the combined light ($F_1$ and $f_{p1}$) is routed to the optical fiber 492 where FWM interaction can be induced. In a step 520, FWM in the optical fiber 492 can generate light with a bandwidth W and a frequency band $F_3$, symmetric to the frequency band $F_1$ of the WDM light, and centered about the pump light $f_{p1}$. Next, in a step 525, the pump light $f_{p1}$ can be filtered out of the optical signal emitted by the optical fiber 492 with the optical filter 494. Thereby, the optical signal emitted from the first four-wave mixer 484 comprises $F_1$ and $F_3$, having twice as many optical channels as the WDM light provided by the light source section 482.

In the present embodiment, as shown in FIG. 9, the frequency bands $F_1$ and $F_3$ are separated by an interval equal to the bandwidth W of each of the frequency bands, centered about the frequency ($f_{p1}$) of the pump light.

Next, a process similar to that executed in the first four-wave mixer 484 can be executed in the second four-wave mixer 486. In a step 530, the light emitted from the first four-wave mixer 484 can be combined with pump light ($f_{p2}$) from the pump light source 496 in the optical combining section 498. The combined light from the optical combining section 498 can be routed to the optical fiber 500 wherein the nonlinear characteristics of the fiber 500 can induce FWM. In a step 535, FWM in the optical fiber 500 can generate light at frequency bands $F_2$ and $F_4$, each with a bandwidth W. As can be seen in FIG. 9, frequency band $F_2$ is located between frequency bands $F_1$ and $F_3$, and frequency band $F_4$ is located next to frequency band $F_3$ on the low frequency side. Next, in a step 540, the pump light $f_{p2}$ can be filtered out of the optical signal emitted from the optical fiber 500 with the optical filter 502. Thereby, an optical signal is emitted from the multi-frequency light source having a continuous frequency band with a bandwidth of 4 W, comprising frequency bands $F_1$, $F_2$, $F_3$, and $F_4$, with four times as many optical channels as present in the original WDM light emitted from the light source section 482.

Moreover, in the second four-wave mixer 486, the light of frequency band $F_1$ and the light of frequency band $F_3$ become the probe light, and FWM interaction between the probe light and the pump light $f_{p2}$ can be induced in the optical fiber 500. As a result, FWM light can be generated in each of the frequency bands $F_2$ and $F_4$. The case illustrated in FIG. 9 shows the frequency band $F_2$ generated at the interval W in the frequency band between the $F_1$ and $F_3$ frequency bands. Also, the frequency band $F_4$ is generated at the bandwidth W continuously on the low frequency side of the frequency band $F_3$. As a result, the frequency bands $F_1$, $F_2$, $F_3$, and $F_4$ become the frequency band of the WDM light emitted from the light source 480, wherein the optical channels are continuous on the frequency axis without overlapping. More specifically, where the incident WDM light provided by the light source section 482 has four optical channels, the light emitted by the multi-frequency light source 480 can have sixteen channels.

Although only two four-wave mixers are illustrated in FIG. 8, the present invention is not intended to be limited thereto, and a light source comprising N four-wave mixers coupled in series, wherein FWM interaction is carried out N times, is within the scope of the invention.

Figure 10:
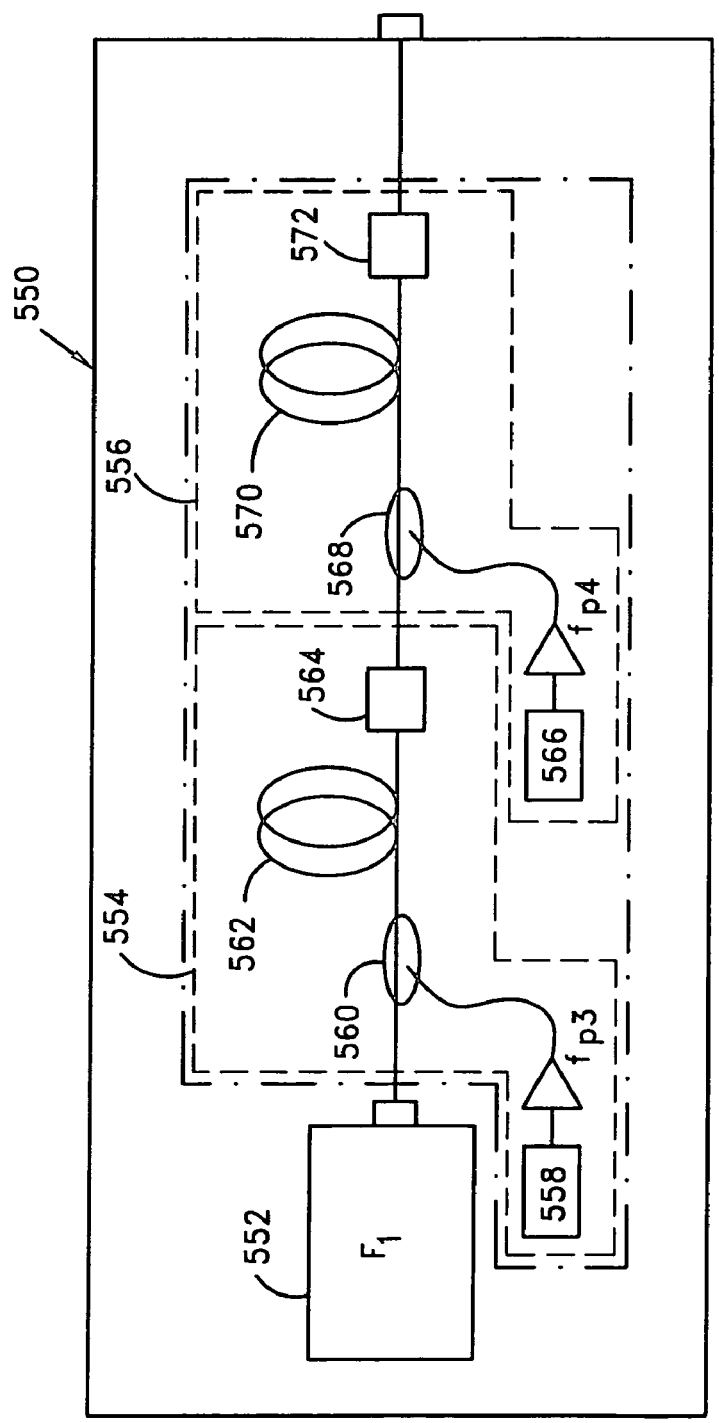
FIG. 10 is a block diagram of one embodiment of a multi-frequency light source.

FIG. 10 illustrates an additional embodiment of a multi-frequency light source 550. The light source 550 comprises a light source section 552, similar to the light source section 482, and two four-wave mixers 554, 556 optically coupled in series.

The first four-wave mixer 554 comprises a pump light source 558, an optical combining section 560, a nonlinear medium 562 implemented with an optical fiber, and an optical filter 564. The frequency ($f_{p3}$) of pump light produced by the pump light source 558 can be near the zero dispersion frequency ($f_o$) of the optical fiber 562.

The second four-wave mixer 556 comprises a pump light source 566, an optical combining section 568, a nonlinear medium 570 implemented with an optical fiber, and an optical filter 572. The frequency ($f_{p4}$) of pump light produced by the pump light source 566 can be near the zero dispersion frequency ($f_o$) of the optical fiber 570.

A method of generating multi-frequency light employing the light source of FIG. 8 is illustrated in the flow diagram of FIG. 11. In a step 575, the light source section 552 can emit an optical signal having the frequency band $F_1$ with, for example, four optical channels. In a step 580, the optical signal from the light source section 552 can then be combined with pump light from the pump light source 558 ($f_{p3}$) in the optical combining section 560. In the present embodiment, the frequency ($f_{p3}$) of the pump light from the pump light source 560 can be located on the frequency band on the low frequency side of the lowest optical channel of the frequency band $F_1$ of the WDM light, as shown in FIG. 11. The combined light ($F_1$ and $f_{p3}$) can then be routed to the optical fiber 562 having nonlinear characteristics so as to induce FWM. As a result of FWM, light with a frequency band $F_2$ can be generated in the optical fiber 562 in a step 585, and the pump light ($f_{p3}$) can be removed from the light emitted from the optical fiber 562 with the optical filter 564 in a step 590.

The optical signal emitted from the first four-wave mixer 554, comprising the two frequency bands $F_1$ and $F_2$, can become the probe light for the second four-wave mixer 556, where it can be combined with pump light ($f_{p4}$) from the pump light source 566 in the optical combining section 568 in a step 595. The combined light ($F_1$, $F_2$, and $f_{p4}$) can then be routed to the optical fiber 570 having nonlinear characteristics so as to induce FWM. In the present embodiment, the frequency $f_{p4}$ of the pump light from the pump light source 566 can be located on the frequency band on the low frequency side of the lowest optical channel of the frequency band $F_2$ of the light generated by FWM in the first four-wave mixer. In a step 600, in response to FWM in the optical fiber 570, light with a frequency band $F_3$ can be generated in response to the frequency band $F_2$, and light with a frequency band $F_4$ can be generated in response to the frequency band $F_1$. In a step 605, the pump light $f_{p4}$ can then be filtered out of the optical signal emitted from the optical fiber 570, prior to emission of the signal from the light source 550. Thereby, light emitted from the light source 550 comprises the four frequency bands $F_1$, $F_2$, $F_3$, and $F_4$.

More specifically, in the case where each frequency band ($F_1$, $F_2$, $F_3$, and $F_4$) has a bandwidth W and four optical channels, the optical channels emitted from the light source 550, sixteen in total, make up a continuous frequency band on the frequency axis having a total bandwidth of 4 W.

As previously discussed, the light source of the present invention is not limited to two four-wave mixers producing four times the number of optical channels as are present in the incident WDM light.

Figure 12:
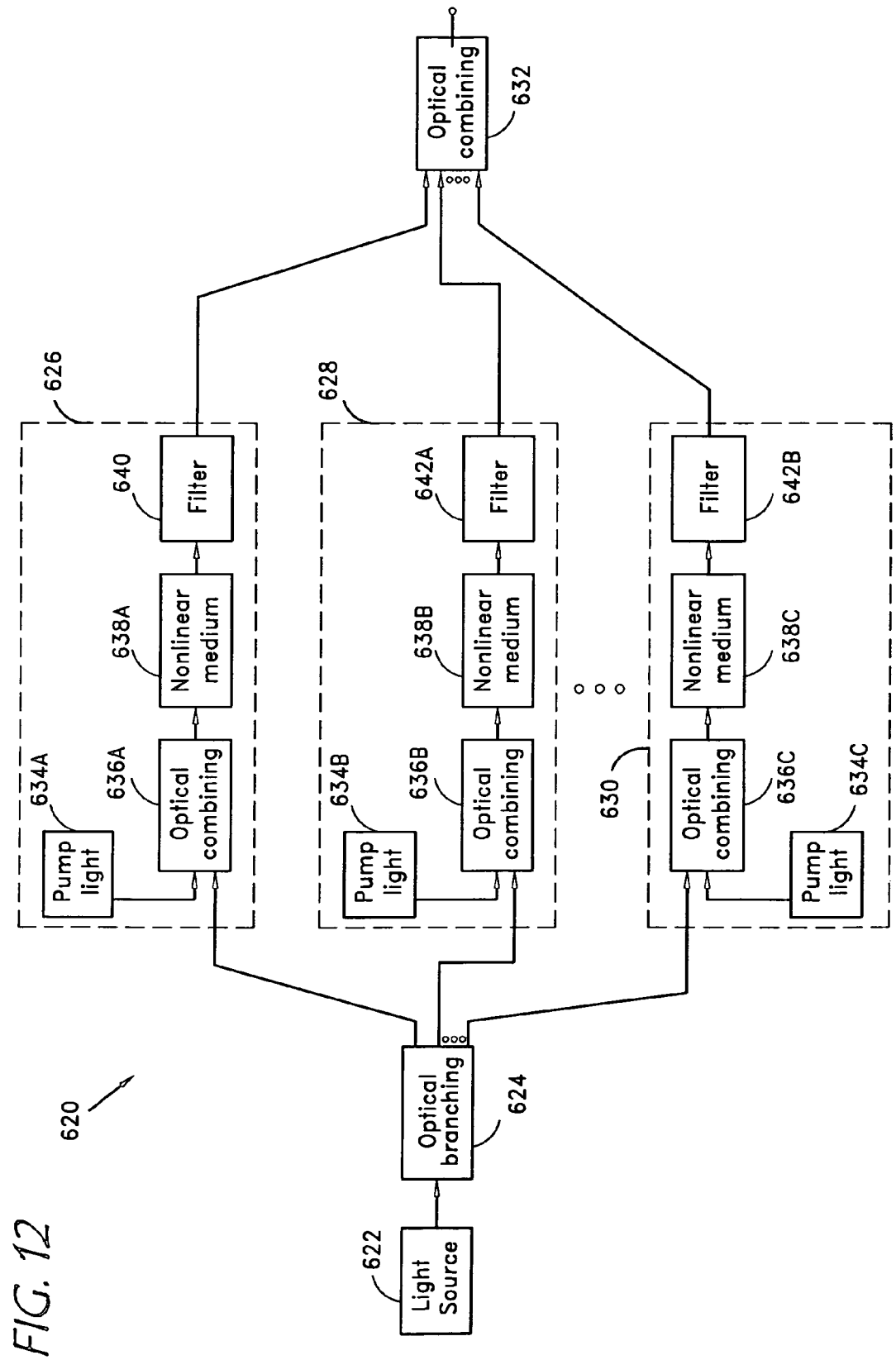
FIG. 12 is a block diagram of one embodiment of a multi-frequency light source.

FIG. 12 is a block diagram of an additional embodiment of a multi-frequency light source 620. The light source 620 comprises a light source section 622, similar to the light source section 442, an optical branching unit 624 configured to branch a multiplexed optical signal to a plurality (N) of four-wave mixers 626, 628, 630 connected in parallel. The light source 620 further comprises an optical combining section 632, wherein optical signals emitted from each of the four-wave mixers 626, 628, 630 are combined into a single optical signal.

Each of the N four-wave mixers 626, 628, 630 comprise, respectively, a pump light source 634A-C, an optical combining section 636A-C, and a nonlinear medium 638A-C, optically connected in series. In each of the N four-wave mixers 626, 628, 630, the optical combining section 636A-C can be configured to combine pump light from the pump light source 634A-C with multiplexed light from the optical branching unit 624, and route the combined light to the nonlinear medium 638A-C for FWM. Wherein pump light emitted from each of the pump light sources 634A-C has a different frequency, FWM light can be generated at a plurality of different frequency bands in response to FWM of pump light and the multiplexed light.

Figure 18:
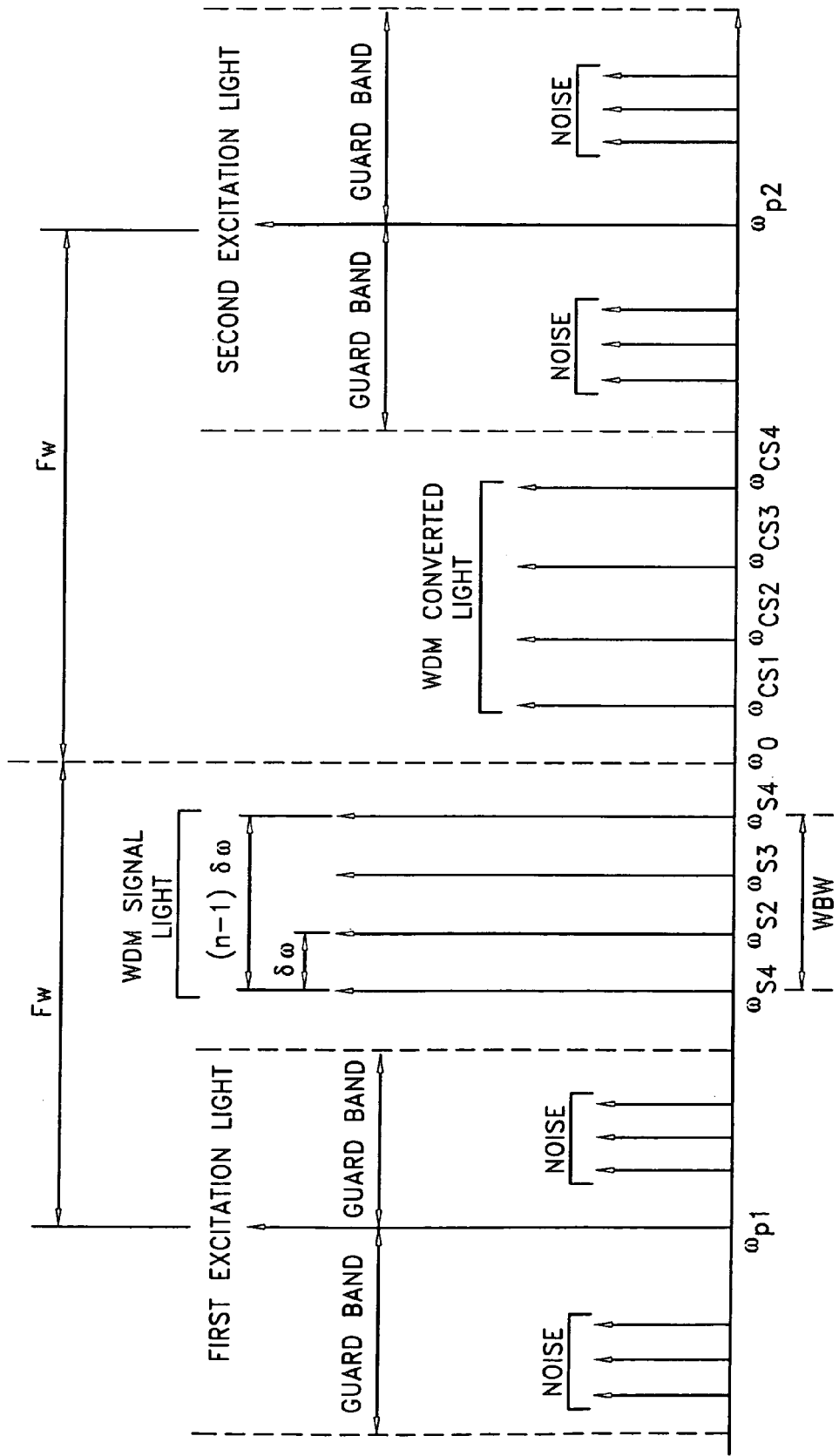
FIG. 18 is an exemplary graphical illustration of FWM of a WDM signal according to a second method of wavelength conversion.
Figure 19:
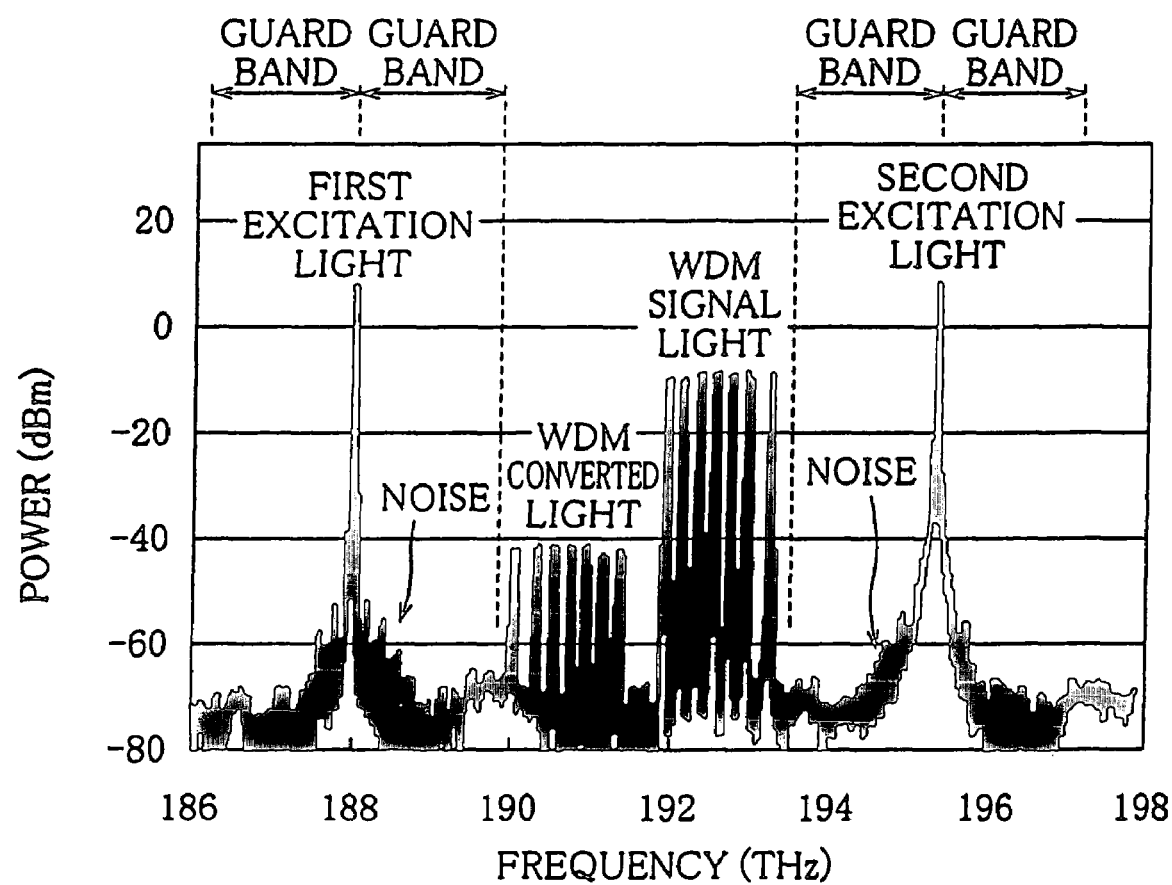
FIG. 19 is an optical spectrum illustrating wavelength conversion according to a second embodiment of a wavelength converter.

In the first four-wave mixer 626, an optical signal emitted from the nonlinear medium 638A can be filtered by a filter 640, such that the pump light frequency is removed from the optical signal, and only the multiplexed light and the FWM light remain in the frequency band. In the second four-wave mixer 628, an optical signal emitted from the nonlinear medium 638B can be filtered by a filter 642A, such that the pump light frequency and the multiplexed light frequency band are removed from the optical signal, and only the light generated by FWM remains in the frequency band. Similarly, a filter 642B can be used in the Nth four-wave mixer 630 such that the pump light frequency and the multiplexed light frequency band are removed from the optical signal from the nonlinear medium 638C, and only the FWM generated light remains in the frequency band. Thereby, as the frequency bands of the optical signals from the N four-wave mixers 626, 628, 630 are combined in the optical combining section 632, the multiplexed light frequency band is only produced once, and each of the frequency bands from the N four-wave mixers 626, 628, 630 do not overlap. Thus the light source 620, comprising N four-wave mixers, can produce an optical signal having N+1 times as many optical channels as are present in the multiplexed optical signal provided by the light source section 622. The operation of a multi-frequency light source implementing the structure of light source 620 is described with more detail in reference to FIGS. 18, 19, and 20.

FIG. 13 is a block diagram of a multi-frequency light source 650, implementing the parallel structure illustrated and described with respect to FIG. 12. The light source 650 comprises a light source section 652 and an optical multiplexing section 654 connected in series. The light source section 652 provides WDM light ($F_1$), comprising a number of optical channels, to the optical multiplexing section 654. The optical multiplexing section 654 comprises three four-wave mixers 656, 658, 660 connected in parallel with an optical branching unit 662. The optical branching unit 662 receives the WDM light from the light source section 652 and branches the signal such that each four-wave mixer 656, 658, 660 receives an optical signal with the frequency band $F_1$. An optical combining section 664 is connected to an output of each of the four-wave mixers 656, 658, 660, to combine the output signals from the four-wave mixers and provide an output signal to an output port 666 of the light source 650.

The first four-wave mixer 656 comprises a pump light source ($f_{p5}$) 668, an optical combining section 670, a nonlinear medium 672, implemented herein as an optical fiber, and an optical filter 674 configured to remove the pump light frequency $f_{p5}$. The second four-wave mixer 658 comprises a pump light source ($f_{p6}$) 676, an optical combining section 678, a nonlinear medium 680, implemented herein as an optical fiber, and an optical filter 682 configured to transmit only light generated by FWM in the optical fiber 680. Similarly, the third four-wave mixer 660 comprises a pump light source ($f_{p7}$) 684, an optical combining section 686, a nonlinear medium 688, implemented herein as an optical fiber, and an optical filter 690 configured to transmit only light generated by FWM in the optical fiber 686.

Figure 20:
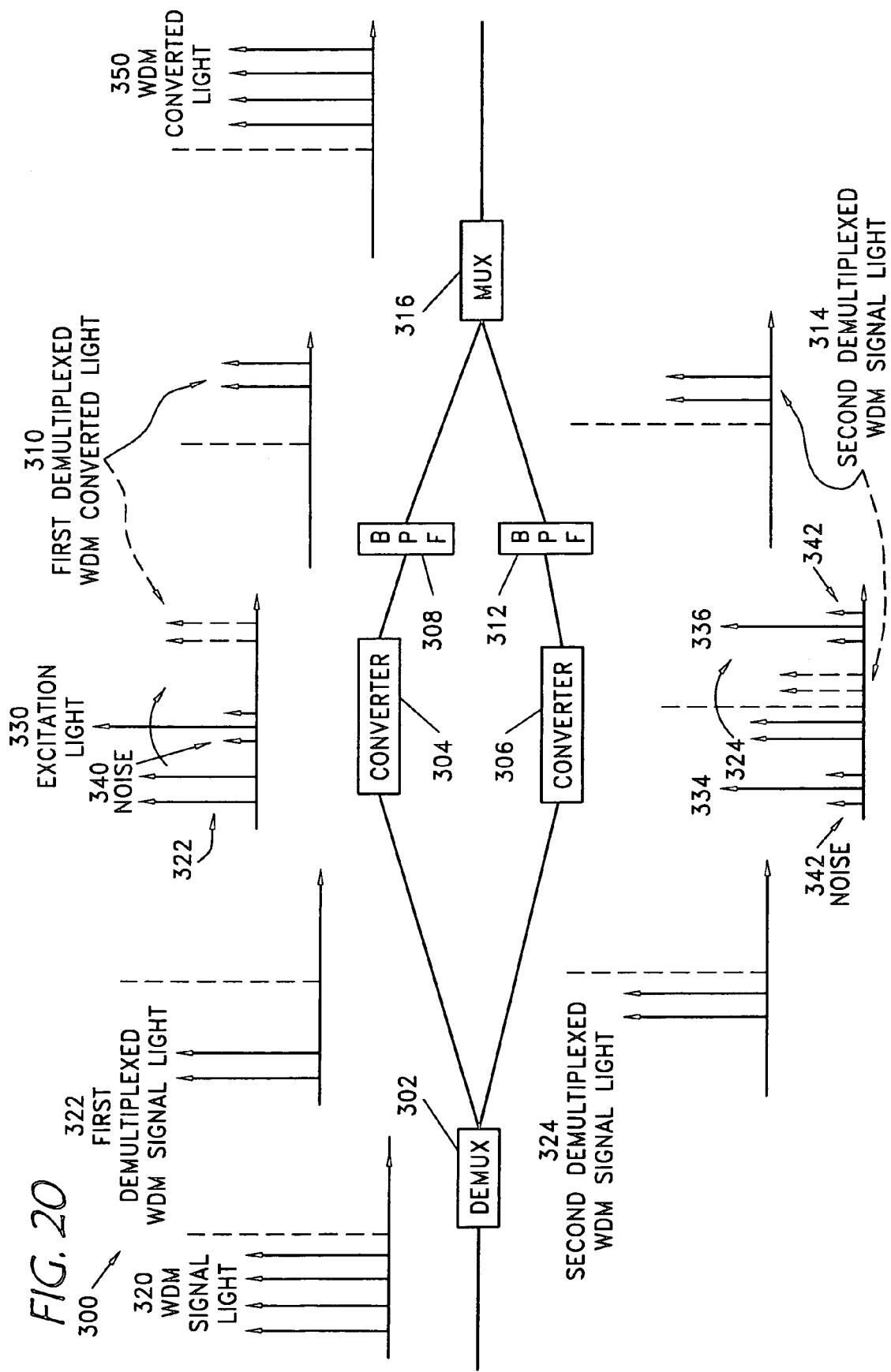
FIG. 20 is a block diagram of one embodiment of a wavelength converter according to the present invention.

A method of producing a multi-frequency light signal utilizing the light source 650 is illustrated in the flow diagram of FIG. 9 and frequency band diagram of FIG. 20. In a step 702, the light source section 652 provides WDM light in the frequency band $F_1$ comprising four optical channels at frequency intervals of $\Delta f$. WDM light ($F_1$) from the light source section 652 is received by the optical multiplexing section 654 and branched by the branching section 662 to each of the four-wave mixers 656, 658, 660 in a step 704.

In the first four-wave mixer 656, in a step 706, the optical combining section 670 combines the WDM light ($F_1$) from the optical branching unit 662 with pump light ($f_{p5}$) from the pump light source 668. The combined light ($F_1$ and $f_{p5}$) can then be routed to the optical fiber 672 having nonlinear characteristics so as to induce FWM. As a result of FWM in the optical fiber 672 in a step 708, light at a frequency band $F_2$ can be generated such that the optical signal at the output of the optical fiber 672 comprises $F_1$, $F_2$, and $f_{p5}$. More specifically, the frequency band $F_2$ of the FWM light is symmetric to the $F_1$ frequency band of the incident WDM light centered about the pump light frequency ($f_{p5}$). The pump light frequency ($f_{p5}$) can be filtered out of the optical signal from the optical fiber 672 in a step 710 by the optical filter 674, such that the optical signal produced by the first four-wave mixer 656 comprises the frequency bands $F_1$ and $F_2$ having a total of eight optical channels.

In the second four-wave mixer 658, the optical combining section 678 combines the WDM light ($F_1$) from the optical branching unit 662 with pump light ($f_{p6}$) from the pump light source 676 in a step 712. The combined light ($F_1$ and $f_{p6}$) can then be routed to the optical fiber 680 having nonlinear characteristics so as to induce FWM. As a result of FWM in the optical fiber 680 in a step 714, light at a frequency band $F_3$ can be generated, symmetric to the WDM light $F_1$ and centered about the pump light frequency ($f_{p6}$), such that the optical signal at the output of the optical fiber 680 comprises $F_1$, $F_3$, and $f_{p6}$. The pump light frequency $f_{p5}$ and the original WDM frequency band $F_1$ can then be filtered out of the signal emitted from the optical fiber 680 in a step 716 by the optical filter 682, such that the optical signal produced by the second four-wave mixer 658 comprises only the frequency band $F_3$, consisting of four optical channels, produced by FWM.

In the third four-wave mixer 660, in a step 718 the optical combining section 686 combines the WDM light ($F_1$) from the optical branching unit 662 with pump light ($f_{p7}$) from the pump light source 684. The combined light ($F_1$ and $f_{p7}$) is then routed through the optical fiber 688 having nonlinear characteristics so as to induce FWM. As a result of FWM in the optical fiber 688, light at a frequency band $F_4$ can be generated in a step 720, symmetric to the WDM light $F_1$ and centered about the pump light frequency $f_{p7}$, such that the optical signal at the output of the optical fiber 688 comprises $F_1$, $F_4$, and $f_{p7}$. The pump light frequency $f_{p7}$ and the original WDM frequency band $F_1$ can then be filtered out of the signal from the optical fiber 688 in a step 722 by the optical filter 690, such that the optical signal produced by the third four-wave mixer 660 comprises only the frequency band $F_4$ produced by FWM.

In a step 724, the optical combining section 664 combines the output signals from the four-wave mixers 656, 658, 660, receiving frequency bands $F_1$ and $F_2$ from the first four-wave mixer 656, frequency band $F_3$ from the second four-wave mixer 658, and frequency band $F_4$ from the third four-wave mixer 660. The combined light is then emitted from the multi-frequency light source 650 from the output port 666. The emitted WDM light has a frequency band consisting of sixteen optical channels, which are continuous on the frequency axis, and comprising the frequency bands $F_1$, $F_2$, $F_3$, and $F_4$.

Similar to the other multi-frequency light sources 400, 480, 550 previously discussed, the light source 650 utilizes only the proper FWM phenomenon and not the improper, high-order FWM. Thus, correlation degradation of the pump light and the incident WDM light does not occur and a multi-frequency light source producing light with exceptional wavelength spectrum flatness can be realized in the present embodiment.

In the present embodiment of the light source 650, the frequency of the pump light in each of the four-wave mixers 656, 658, 660 can be set to a position on the frequency band such that the frequency bands of the light generated by FWM do not overlap each other when combined, as illustrated in FIG. 10. Regarding the optical fibers 672, 680, 688, the optical fibers can be selected such that the location where the group velocity dispersion of each fiber becomes zero is in the vicinity of the frequency of the corresponding pump light.

More specifically, the pump light frequencies ($f_{p5}$, $f_{p6}$, and $f_{p7}$) for the four-wave mixers of the light source 650 can be selected so as to satisfy Equations (4), (5), and (6). The lowest frequency of the optical channel in the frequency band $F_1$ is referred to as $f_x$, the frequency interval between optical channels is $\Delta f$, and the width of the frequency bands is referred to as W.

$$f_{p5} = f_x - \frac{\Delta f}{2} \tag{4}$$

$$f_{p6} = f_{p5} - \frac{(W + \Delta f)}{2} \tag{5}$$

$$f_{p7} = f_{p5} - W - \Delta f \tag{6}$$

When the pump light frequencies are selected so as to satisfy the above equations, WDM light having a frequency band of continuous optical channels on the frequency axis can be obtained without overlapping of optical channels. In addition, because the individual channels do not overlap, a light source producing four times as many optical channels as the channels present in the incident WDM light can be realized.

Although the light source 650 is illustrated and described as having three four-wave mixers connected in parallel, the invention is not limited thereto, wherein M four-wave mixers can be connected in parallel. In the case where incident WDM light comprises n optical channels and M four-wave mixers are implemented in parallel, the multi-frequency light source can produce n×(M+1) optical channels.

It should be noted that in each of the previously described multi-frequency light sources 400, 480, 550, 650 each of the pump light sources produced pump light at a single frequency. In the case where the pump light has two different frequencies ($f_{p1}$ and $f_{p2}$), the effective frequency for the purposes of FWM is given by $$\frac{(f_{p1} + f_{p2})}{2}.$$

FIGS. 16-19 illustrate the positional relationship of a WDM signal prior to wavelength conversion, the WDM converted signal after wavelength conversion, and high order FWM generated signals on the frequency axis. In these Figures, the high order signals are referred to as "noise," and are preferably not utilized as outputs in multi-frequency light sources. As shown in these Figures, the high order FWM signals appear within "guard bands" around the pump source frequencies.

The use of a four wave mixing converter having a single pump source in parallel with a four wave mixing converter having two pump sources can produce a multi-frequency light source that is completely free of signals generated by high-order FWM. One embodiment of such a wavelength converter 300 is illustrated in the block diagram of FIG. 20.

This embodiment of a light source 300 comprises a demultiplexer 302, a first wavelength converting section 304 which executes the first wavelength converting method with a single pump source, a second wavelength converting section 306 which executes the second wavelength converting method with two pump sources, a first filter 308 which passes only first WDM converted light 310 in the output of the first wavelength converting section 304, a second filter 312 which passes only second WDM converted light 314 in the output of the second wavelength converting section 306, and a multiplexer 316, which multiplexes the first WDM converted light 310 and the second WDM converted light 314, as shown in FIG. 20.

In the wavelength converter 300, WDM signal light 320 for wavelength conversion is applied to the demultiplexer 302. The demultiplexer 302 demultiplexes the input WDM signal 320 into two WDM signals of different frequency bands 322, 324, wherein the first demodulated WDM signal 322 is input to the first wavelength converting section 304 while the second demultiplexed WDM signal 324 is input to the second wavelength converting section 306.

The first wavelength converting section 304 can have a conversion medium into which the first demultiplexed WDM signal 322 and one pump lightwave 330 enter. The wavelength converting section 304 can be designed such that the interval between a frequency of the first demultiplexed WDM signal 322 closest to the frequency of the single pump lightwave 330, and the frequency of the pump lightwave 330 becomes, as the guard band, equal to or larger than the frequency bandwidth of the first demultiplexed WDM signal 322.

The second wavelength converting section 306 can have a conversion medium into which the second demultiplexed WDM signal 324 and two pump lightwaves 334, 336 enter. The second wavelength converting section 306 can be designed such that the frequency of the second demultiplexed WDM signal 324 is positioned between the average frequency of the two pump lightwaves 334, 336 and a frequency of the two pump lightwaves 334, 336, and the interval between that one frequency and the average frequency becomes, as the guard band, equal to or larger than twice the frequency bandwidth of the second demultiplexed WDM signal 324.

The first demultiplexed WDM signal 322 from the demultiplexer 302 can be demultiplexed so as to include the frequency component that lies closest to the frequency of the one pump lightwave 330 discussed above. The second demultiplexed WDM signal 324 from the demultiplexer 302 can be demultiplexed so as to include the frequency components that lie closest to the average frequency of the two pump lightwaves 334, 336.

In the first wavelength converting section 304, the wavelength-converted first demultiplexed WDM converted signal 310 is produced at the mirror symmetric positions on the frequency axis, centered about the frequency of the single pump lightwave 330, i.e., outside of the guard band, by FWM of the first demultiplexed WDM signal 322 and the single pump lightwave 330. At the same time, noise 340 frequencies originating from high-order FWM are generated in the guard band.

In the second wavelength converting section 306, the wavelength-converted second demultiplexed WDM converted signal 314 is produced at the mirror symmetric positions on the frequency axis, centered about the average frequency of the two pump lightwaves 334, 336, i.e., inside the guard band, by FWM of the input second demultiplexed WDM 324 signal and the two pump lightwaves 334, 336. At the same time, noise 342 frequencies originating from high-order FWM are generated outside the guard band.

The output of the first wavelength converting section 304 is applied to the first filter 308 and only the first demultiplexed WDM converted signal 310 passes through the first filter 308. That is, the first demultiplexed WDM signal 322, the pump lightwave 330, and the high order FWM signals 340 can all be eliminated.

The output of the second wavelength converting section 306 is applied to the second filter 312 and only the second demultiplexed WDM converted signal 314 passes through the second filter 312. That is, the second demultiplexed WDM signal 324, the pump lightwaves 334, 336, and the high order FWM signals 342 can all be eliminated.

Following the filters 308, 312, the converted signals 310, 314 are multiplexed by the multiplexer 316. This provides WDM converted light 350 which is wavelength-converted light of WDM signal light 320 and can be completely free of noise 340, 342 generated by high-order FWM.

The demultiplexer 302 and the multiplexer 316 can be implemented, for example, with an arrayed waveguide type demultiplexer and Mach-Zehnder type multiplexer, respectively.

Given that a first branch in the wavelength converter shown in FIG. 20 incorporates the first wavelength converting section 304 and the first filter 308, and a second branch incorporates the second wavelength converting section 306 and the second filter 312, the guard band will be empty and no noise will be present on the output side of the first branch. However, on the output side of the second branch, only WDM converted light will be present in the guard band of the first branch. After the WDM converted signals pass through the multiplexer 316, the formerly empty guard band is filled with the frequency band of the latter WDM converted signal. Therefore, the optical frequency band can be used effectively in such a multi-frequency light source.

In operation, when the frequency bandwidth of the WDM signal prior to wavelength conversion is wide, it may be beneficial for the WDM signal to be demultiplexed to a plurality of WDM signals having narrower frequency bandwidths before using the wavelength converter. This can be beneficial because the guard band specified by the frequency bandwidth of the WDM signal prior to wavelength conversion and the FWM conversion efficiency becomes low when the frequency bandwidth of the WDM signal prior to wavelength conversion is wide.

In consideration of the conversion efficiency, in the case of the second wavelength converting method, WDM converted light is present between the average frequency of two pump lightwaves and the guard band whose frequency bandwidth is equal to or higher than the frequency bandwidth of WDM signal light that is to be wavelength-converted, and no pump lightwave is present at the position of the average frequency. The second wavelength converting method therefore does not require filtering of the pump lightwaves and the WDM signal, and thus can be advantageous in the effective use of the optical frequency band.

In view of the above, when the frequency bandwidth of the WDM signal to be wavelength-converted is wide, it can be divided by N. Then, the frequency of a single pump lightwave in the first branch can be set equal to the average frequency of the two pump lightwaves in the second branch. Of the WDM signals resulting from the division by N, the WDM signal that includes the channel whose frequency is closest to the aforesaid average frequency can be wavelength-converted by the second branch. The width of the guard band in the second branch can be set equal to or greater than twice the frequency bandwidth of the WDM signal.

Meanwhile, N−1 branches with single pump sources can be combined in parallel and N−1 divided WDM signals are respectively assigned to these N−1 branches and subjected to wavelength conversion. Naturally, the width of the guard band in each of these branches can be set equal to or greater than the frequency bandwidth of the respectively-assigned divided WDM signals.

As the frequency of the pump lightwave in the single pump source branch is set equal to the average frequency of the two pump lightwaves in the second, two pump source branch, no frequency skip occurs in the WDM converted signal after FWM-based wavelength conversion.

As the N−1 single source branches and the two pump source branch are combined in parallel under the aforesaid configuration, and WDM converted signals that have been produced by the multiple branches are multiplexed, the overall optical frequency band can be used effectively.

In the aforementioned case, however, because the WDM signals entering the separate branches have certain assigned frequency bands, the WDM signal that is transferred over the main transmission path is preferably demultiplexed so as to have frequency components that can be separately processed by the separate branches. To meet such an objective, an arrayed waveguide demultiplexer can be used. Specifically, one of the input lines of the arrayed waveguide demultiplexer can be connected to the main transmission path. As a result, the WDM signal according to each frequency band can be produced from each output waveguide on the output side.

If the individual output waveguides corresponding to the output WDM signals are multiplexed together so as to have the frequency components that are respectively assigned to the separate branches, the demultiplexer would have N frequency components assigned, respectively, to the first branch and the second branch. The multiplexer can be constructed by connecting N output terminals of the branches to an N-to-1 combining unit.

Referring to FIG. 20, if a band-pass filter which eliminates only noise in the guard band is used as the first filter 308, and a band-pass filter which passes only the frequency band in the guard band is used as the second filter 312, for example, WDM signal light prior to wavelength conversion and WDM converted light without noise can be produced after the WDM signals pass through the multiplexer 316. That is, a signal whose wavelength channels become twice the channel frequency of the WDM signal prior to wavelength conversion can be produced.

Therefore, the use of the wavelength converter 300 as a light source can provide a signal having twice the channel frequency of the input signal per single light source. Such a wavelength converter can thus reduce the number of laser diodes used in a light source.

If a plurality of light sources of this type are connected in series, for example, it is possible to construct a light source which provides a signal light whose channel frequency increases to two times, four times, eight times and so forth, depending on the number of light sources implemented. When light sources of the present invention are used, the number of laser diodes required to produce such an effect decreases to ½, ¼, ⅛ and so forth, without utilizing any high order FWM signals.

Figure 21:
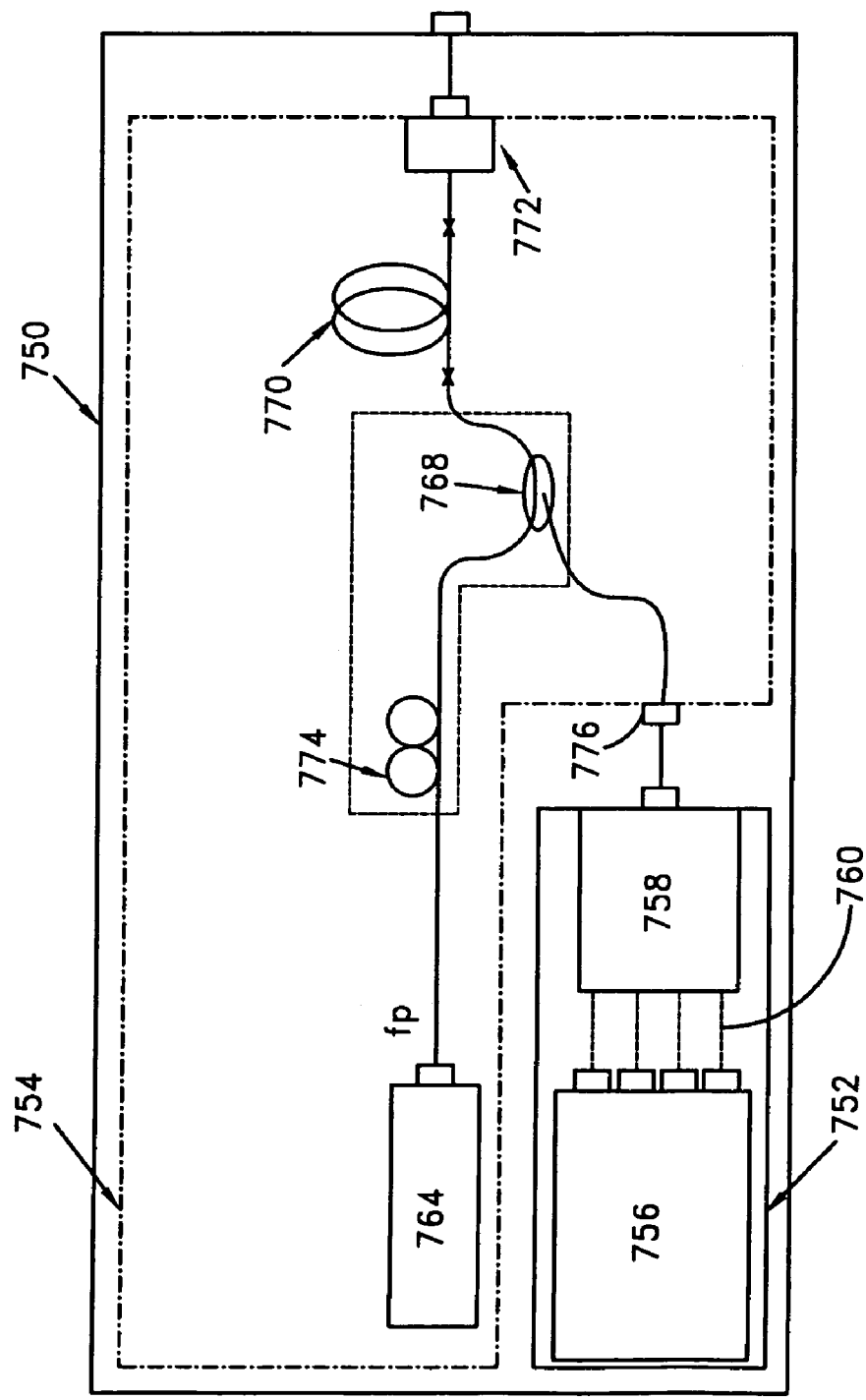
FIG. 21 is a block diagram of one embodiment of a multi-frequency light source.

FIG. 21 is a block diagram of an additional embodiment of a multi-frequency light source 750, similar to the light source 400. The light source 750 comprises a light source section 752 optically coupled to an optical multiplexing section 754.

The light source section 750 comprises a WDM light source 756 configured to emit linearly polarized light, coupled to an optical combining section 758. To maintain the polarization states of the linearly polarized lights emitted from the WDM light source section 756, a polarization maintaining fiber (PMF) 760 can be used to optically connect the WDM light source section 756 to the optical combining section 758.

The optical multiplexing section 754 is a single four-wave mixer in the present embodiment, comprising a pump light source 764, an optical combining section 768, a nonlinear medium 770 (implemented in the present embodiment as an optical fiber), and an optical filter 772. The polarization state of pump light ($f_p$) emitted from the pump source 764 can be controlled by a polarization controller 774 coupled between the pump light source 764 and the optical combining section 768.

In the event the polarization states of the pump light and the incident WDM light match, then the intensity of the FWM generated light can be near maximum. In contrast, if the polarization state of the pump light is perpendicular to the polarization state of the incident WDM light, the intensity of the FWM generated light will be reduced. Journal of Quantum Electronics, Vol. 28, 1992, pp. 883-894, hereby incorporated by reference in its entirety.

The light source section 760 is connected to the optical multiplexing section 754 at an input port 776, which is coupled to the optical combining section 768. The optical combining section 768 is configured to combine the WDM light from the light source section 760 with pump light from the pump light source section 764 to provide a combined optical signal. The polarization controller 774 can be positioned in the optical multiplexer 754 to adjust the polarization state of pump light from the pump light source section 764 so as to match the polarization state of the WDM light received at the optical combining section 768. Matching the polarization states of the pump light and the WDM light can prevent the reduction of the intensity of light generated as a result of FWM of the combined light.

The combined light from the optical combining section 768 can be routed to the optical fiber 770 so as to generate FWM light by FWM interaction in the optical fiber 770. The light emitted from the optical fiber 770 therefore comprises the WDM light, the pump light, and the FWM light. The optical filter 772, coupled to the output of the optical fiber 770, can be configured to filter out the pump light ($f_p$) such that only the WDM light and the FWM light remain in the frequency spectrum of the light emitted from the multi-frequency light source 750.

In an additional embodiment of the multi-frequency light source 750, a monitoring section can be coupled to the output of the optical fiber 770 or optical filter 772, and to the polarization controller 774. The monitoring section can be configured to monitor the FWM light for reduced light intensity. The monitoring section can then communicate such information to the polarization controller 774, and the controller 774 can adjust the polarization of the pump light to match that of the WDM light in response to information from the monitoring section. Alternatively, the polarization states of the pump light and the WDM light can be individually monitored and adjusted to match prior to routing the combined light to the optical fiber 768.

Figure 22:
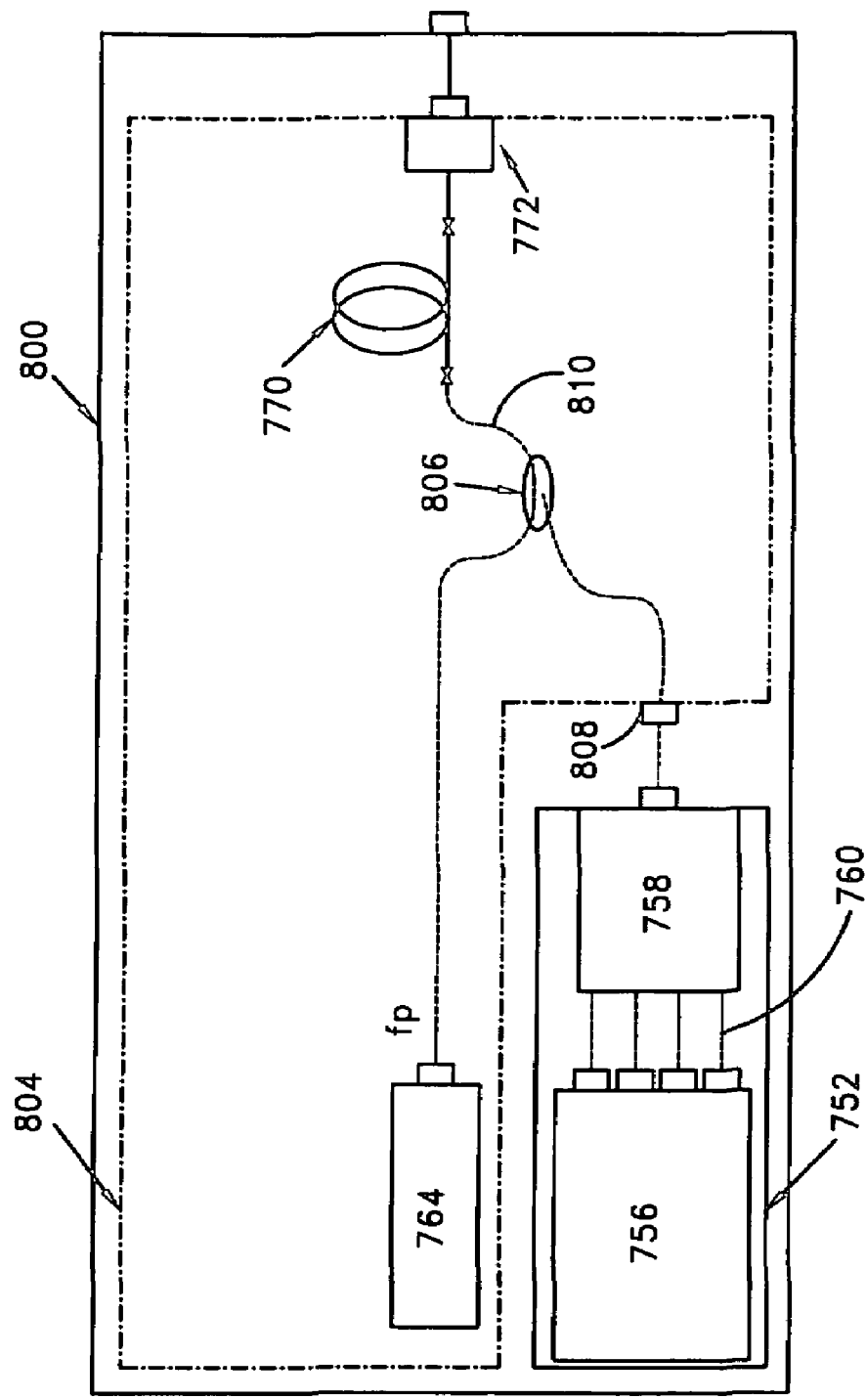
FIG. 22 is a block diagram of one embodiment of a multi-frequency light source.

FIG. 22 is a block diagram of an alternate embodiment 800 of the multi-frequency light source 750. The light source 800 comprises an optical multiplexing section 804 instead of the optical multiplexing section 754.

The optical multiplexing section 804 is a four-wave mixer in the present embodiment, comprising the pump light source 764, an optical combining section 806, the nonlinear medium 770, and the optical filter 772, optically connected in series. The polarization state of pump light ($f_p$) emitted from the pump source 764 can be maintained by implementing a polarization maintaining fiber between the pump light source 764 and the optical combining section 806. An additional PMF 808 can be implemented to connect the light source section 752 to the optical combining section 806 of the four-wave mixer 804, wherein the optical combining section 806 in the present embodiment is implemented with a polarization maintaining optical combining section. Also, a PMF 810 can be used to connect the polarization maintaining optical combining section 806 to an incident end of the optical fiber 770.

In operation, the polarization states of the pump light and the incident WDM light can be matched so as to prevent reduction in intensity of light generated by FWM, and the WDM light and the pump light can be combined in the polarization maintaining optical combining section 806. The combined light can then be routed to the incident end of the optical fiber 770 via the PMF 810. Nonlinear characteristics of the optical fiber 770 can then induce four-wave mixing so as to generate FWM light at the output of the optical fiber in addition to the WDM light and pump light.

Figure 23:
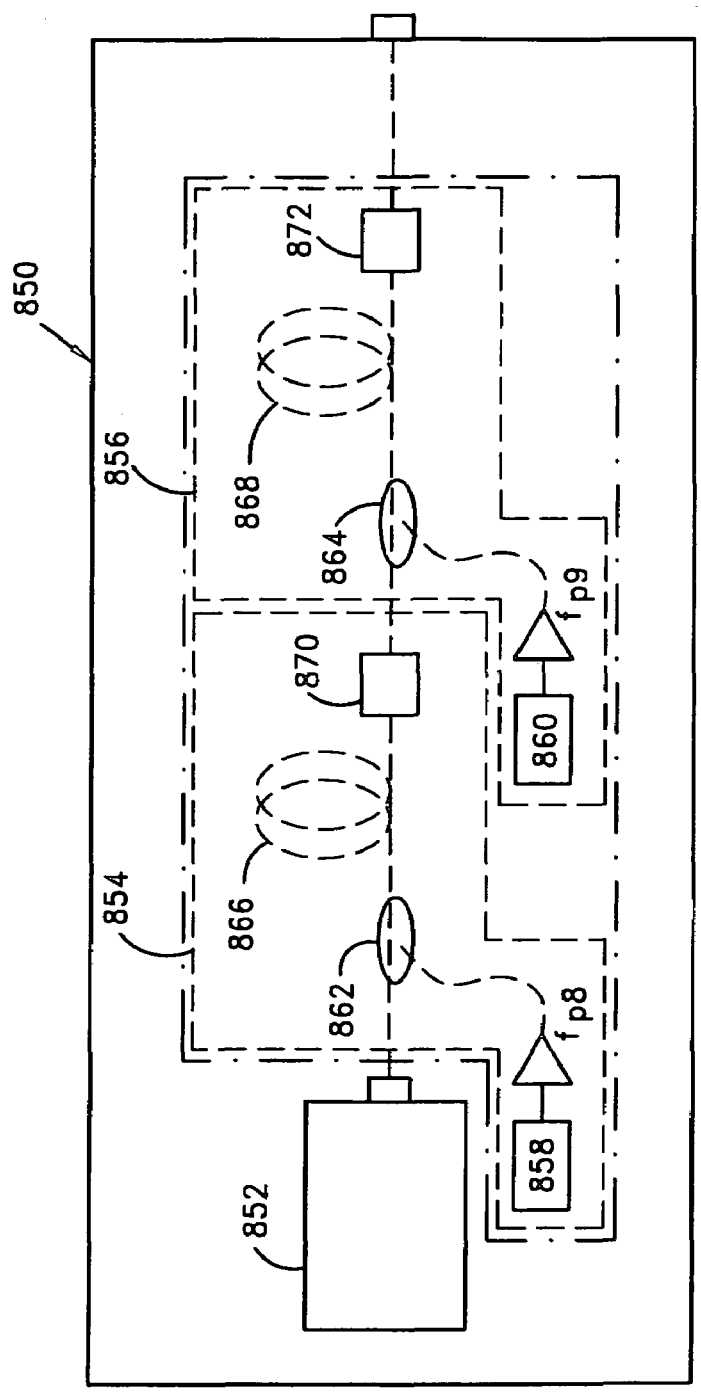
FIG. 23 is a block diagram of one embodiment of a multi-frequency light source.

The block diagram of FIG. 23 illustrates an additional embodiment of a multi-frequency light source 850, similar to the multi-frequency light source 550. The light source 850 comprises a WDM light source 852, and an optical multiplexing section 853 comprising a first-four wave mixer 854, and a second four-wave mixer 856, optically connected in series. Each of the four-wave mixers 854, 856 comprise a pump light source 858, 860, a polarization maintaining optical combining section 862, 864, a nonlinear medium implemented with an optical fiber 866, 868, and an optical filter 870, 872, respectively, optically connected in series.

The WDM light source 852 and the pump light source 858 of the first-four wave mixer 854 can be connected to the optical combining section 862 with PMF's such that the polarization state of the pump light matches that of the WDM light upon combining in the optical combining section 862. The combined light from the optical combining section 862 can be routed to the optical fiber 866 via a PMF, and FWM interaction can be induced in the optical fiber 866 to generate FWM light. The light emitted from the optical fiber 866, which includes the WDM light, the pump light, and the FWM generated light, can be routed to the optical filter 870, via an additional PMF, where the pump light can be filtered out such that only the WDM light and the FWM generated light are emitted from the first four-wave mixer 854.

The second four-wave mixer 856 operates similarly to the first four-wave mixer 854, however the new incident WDM light comprises WDM light and FWM generated light from the first four-wave mixer 854. The output of the optical filter 870 and the pump light source 860 can be connected to the optical combining section 864 with PMF's, such that the polarization state of the new incident WDM light matches that of the pump light of the second four-wave mixer 856. The combined light can then be routed to an incident end of the optical fiber 868, via a PMF, wherein the nonlinear characteristics of the optical fiber 868 can generate additional FWM light. The light emitted from the optical fiber 868 can then be routed to the optical filter 872, also via a PMF, where the pump light from the pump light source 860 can be filtered out. Thereby, the light emitted from the second four-wave mixer, and thus the light source 850, comprises the original incident WDM frequency band, a FWM frequency band generated in the first four-wave mixer 854, and two FWM frequency bands generated in the second four-wave mixer 856.

The use of PMF's to connect the elements of the light source can maintain a matched polarization state of the optical channels throughout the combining and FWM processes occurring in the light source 850, such that the intensity of the light generated by FWM is not reduced. As a result of FWM in the first and second four-wave mixers 854, 856, the light emitted from the light source 850 has four times the number of optical channels as the light provided by the light source section 852. It will be appreciated that the multi-frequency light source is not limited to the series connection or number of four-wave mixers according to FIG. 23. In addition, a multi-frequency light source having N four-wave mixers connected in series can be implemented as a light source according to the present invention.

Figure 24:
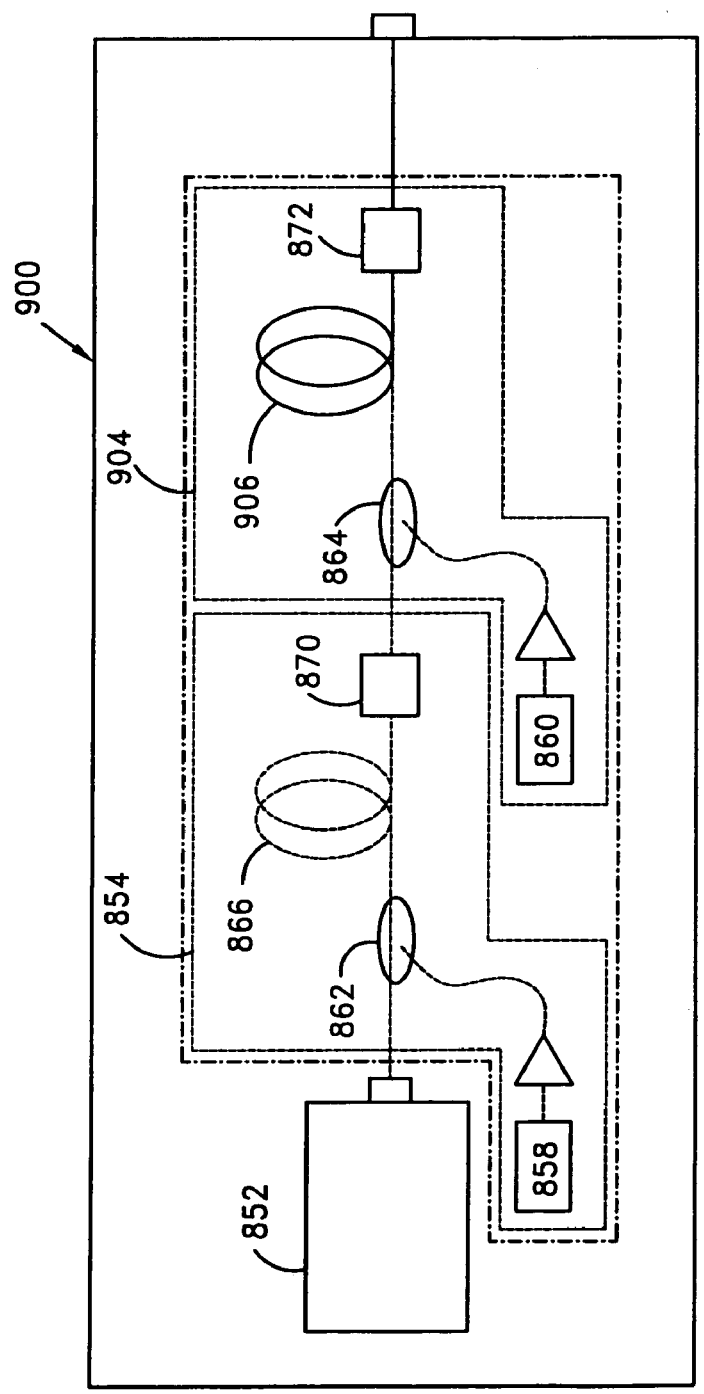
FIG. 24 is a block diagram of one embodiment of a multi-frequency light source.

FIG. 24 illustrates an alternate embodiment 900 of the multi-frequency light source 850. The light source 900 comprises the light source section 852, and an optical multiplexing section 902 comprising the first four-wave mixer 854, and a second four-wave mixer 906. The second four-wave mixer 906 comprises the pump light source 860, the optical combining section 864, the optical filter 872, and an optical fiber 908, wherein the PMF connecting the optical fiber 868 and the optical filter 872 from the light source 850 is replaced by the fiber 906 having no polarization maintaining characteristics. In the light source 900, the polarization states of the pump light and incident WDM light can be matched using the connecting PMF's until incidence to the optical fiber 872 in the second four-wave mixer 906. In the event further FWM is not desired following the optical fiber 872, then it may not be necessary to maintain the polarization state of the light emitted from the optical fiber 872.

An alternative to polarization maintaining fibers to maintain polarization states of the optical signals is to use shortened optical fibers. FWM in a shortened fiber has been shown to have comparable conversion efficiency to those fibers having polarization maintaining characteristics. In the article *Electronics Letters*, Vol. 36, 2000, pp. 709 to 711, hereby incorporated by reference in its entirety, a FWM technique is presented wherein a probe light undergoes FWM with a pump light in a high-nonlinearity-dispersion shifted fiber (HNL-DSF). The article illustrates the FWM efficiency for HNL-DSF's with different lengths, wherein the shorter length fibers, 200 m or less, exhibited the highest conversion efficiency when the input pump power was 100 mW, or about 100 times the power of the probe light.

Figure 25:
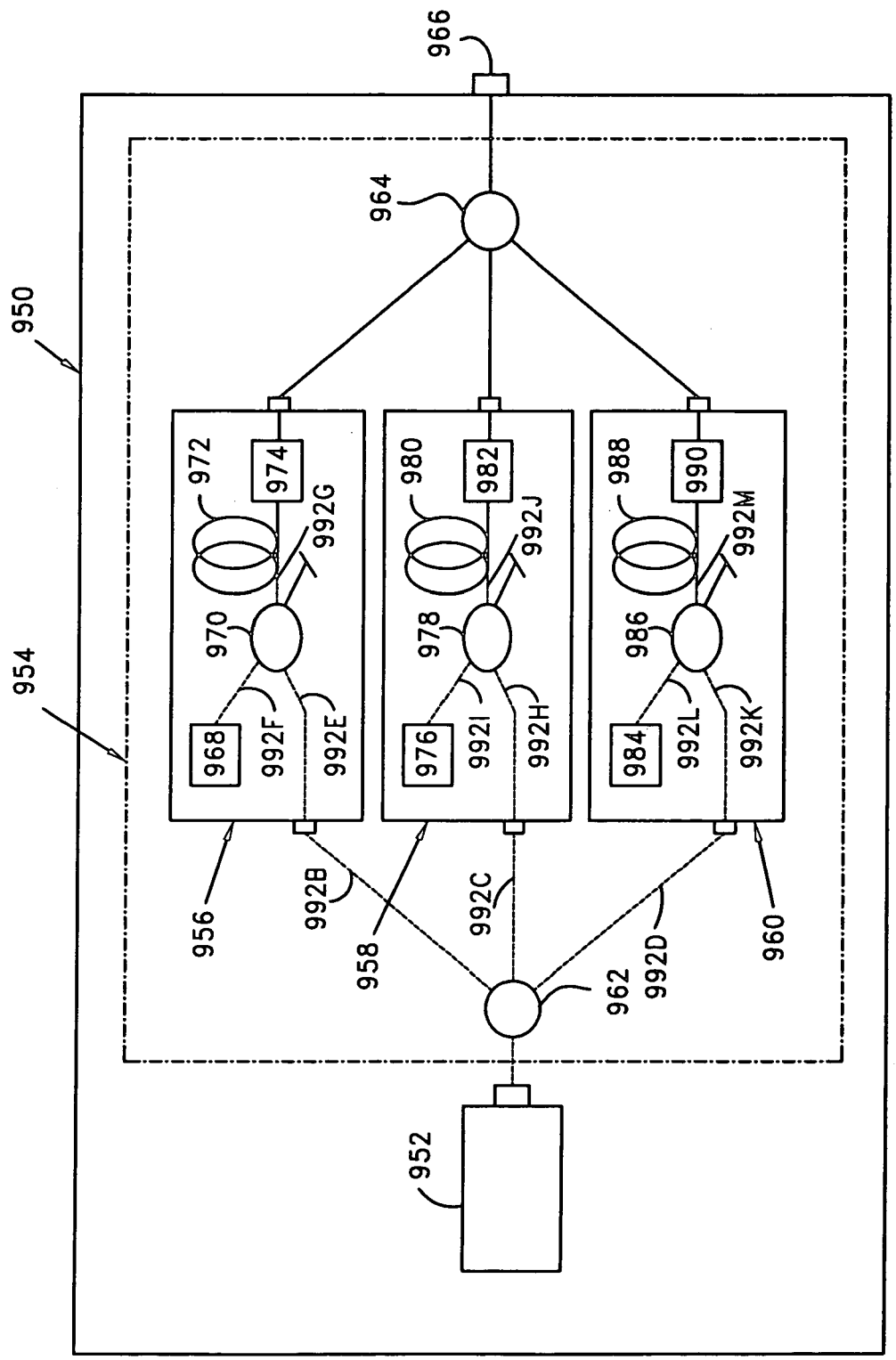
FIG. 25 is a block diagram of one embodiment of a multi-frequency light source.

The block diagram of FIG. 25 illustrates an additional embodiment of a multi-frequency light source 950, similar to the multi-frequency light source 650. The multi-frequency light source 950 comprises a light source section 952, configured to emit WDM light, optically coupled to an optical multiplexing section 954. The optical multiplexing section 854 comprises three four-wave mixers 956, 958, 960 connected in parallel, wherein each four-wave mixer 956, 958, 960 has an input connected to an optical branching unit 962. An optical combining section 964 is connected to an output of each of the four-wave mixers 956, 958, 960, to combine the output signals from the four-wave mixers and provide an output signal to an output port 966 of the light source 950

The first four-wave mixer 956 comprises a pump light source 968, a polarization maintaining optical combining section 910, a nonlinear medium 972, implemented herein as an optical fiber, and an optical filter 974 configured to remove the pump light frequency. The second four-wave mixer 958 comprises a pump light source 976, a polarization maintaining optical combining section 978, a nonlinear medium 980, implemented herein as an optical fiber, and an optical filter 982 configured to transmit only light generated by FWM in the optical fiber 980. Similarly, the third four-wave mixer 960 comprises a pump light source 984, a polarization maintaining optical combining section 986, a nonlinear medium 988, implemented herein as an optical fiber, and an optical filter 990 configured to transmit only light generated by FWM in the optical fiber 986.

In the multi-frequency light source 950, the optical connections between the light source section 952 and the optical branching unit 962, and the optical branching unit 962 and the four-wave mixers 956, 958, 960 are made with polarization maintaining fibers 992A-D. The PMF's 992A-D can maintain the polarization state of the WDM light from the light source section 952 to each of the four-wave mixers 956, 958, 960. Similarly, within each four-wave mixer 956, 958, 960, PMF's 992E-M can be used to connect the input of the mixer 956, 958, 960 and the polarization maintaining optical combining section 970, 978, 986, the pump light source 968, 976, 984 and the polarization maintaining optical combining section 970, 978, 986, and the polarization maintaining optical combining section 970, 978, 986 and the optical fiber 972, 980, 988.

The PMF's 992E-M can match the polarization state of the pump light and the incident WDM light emitted from the light source section 952, and maintain the matched polarization of the combined light from the polarization maintaining optical combining sections 970, 978, 986 to the optical fibers 972, 980, 988. The use of the PMF's 992A-M can increase the efficiency of the FWM interaction in the optical fibers 972, 980, 988 such that the generated FWM light can have maximum intensity.

In the parallel configuration of the light source 950, each of the four-wave mixers 956, 958, 960 is located at a position close to the emission end of the light source 950. Therefore, because there is no further FWM interaction following the four-wave mixers 956, 958, 960, it may not be necessary to maintain or match the polarization states of the light emitted from the four-wave mixers 956, 958, 960. Thus, the optical connections from the emission ends of the optical fibers 970, 978, 986 to the output 966 of the light source 950 do not need to be PMF's. Alternately, the elements from the emission ends of the optical fibers 970, 978, 986 to the output 966 of the light source 950 can be coupled using PMF's, wherein the polarization states of the optical channels emitted from the light source can match one another.

Figure 26:
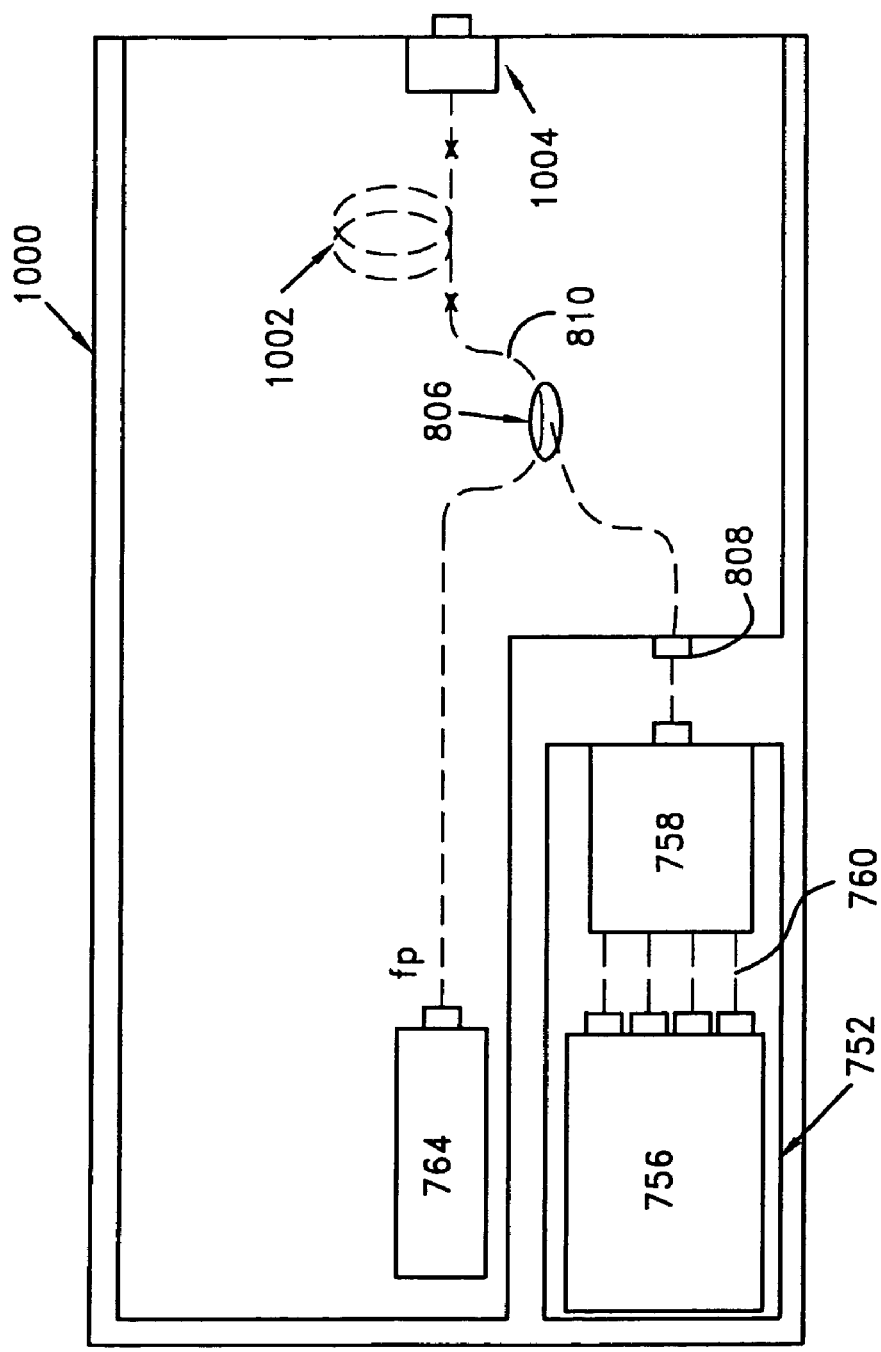
FIG. 26 is a block diagram of one embodiment of a multi-frequency light source.

The block diagram of FIG. 26 illustrates an additional embodiment 1000 of the multi-frequency light source 800. In the light source 1000, the optical fiber 770 of the light source 800 is replaced with a polarization maintaining optical fiber 1002, and the optical filter 772 of the light source 800 is replaced with a polarization maintaining optical filter 1004 configured to transmit only FWM generated light. As compared to the light source 800, the optical elements of the light source 1000 are all coupled with PMF's such that the polarization state of the optical signals can be uniformly maintained and fixed. In addition, the polarization maintaining optical filter 1004 can be configured to allow only FWM generated light, the polarization state of which can be the same as that of the incident WDM light, to be emitted from the light source 1000 by filtering out the pump light frequency and the incident WDM light frequency band.

In an alternate embodiment of the light source 1000, the optical filter 1004 can be replaced with an optical filter configured to remove only the pump light frequency from the light emitted from the optical fiber. Thereby, the light emitted from the multi-frequency light source comprises both the FWM generated light and the incident WDM light.

Note that in each of the above-described embodiments, the optical elements may have polarization maintaining characteristics, or any combination of such elements may have polarization maintaining characteristics. In addition, any of the connections provided between the optical elements may or may not have polarization maintaining characteristics, and the connections are not limited to those configurations shown or described.

In certain embodiments of the multi-frequency light source described herein, the light source section provides linearly polarized light, and the optical multiplexing section is provided with polarization maintaining characteristics. In such embodiments, it is possible to induce FWM interaction multiple times while maintaining the polarization state of the incident light. Thereby, it is possible to cancel incident polarized light dependency in the FWM interactions. In addition, it is also possible to prevent the reduction of the intensity of the light generated by FWM.

In certain embodiments of the multi-frequency light sources described herein, the dependency of the light intensity of the WDM light emitted from the optical multiplexing section on the frequency is small as compared with the case where the high-order FWM interaction is used. However, the light intensity may not be perfectly flat and hence, may have slight frequency dependence in some cases. In such cases, an optical filter component can be disposed at the emission end of the optical multiplexing section such that the dependence of the intensity of the WDM light emitted from the optical multiplexing section on frequency can be canceled.

For example, for an optical fiber amplifier, a gain flattened filter can be implemented wherein a plurality of etalon type filters are combined (Furukawa Electric Review, No. 105, pp. 36-41, 2000, hereby incorporated by reference in its entirety). By combining the etalon type filters, it is possible to manufacture an optical attenuator capable of compensating for the frequency dependency of the light intensity of the light emitted from the optical multiplexing section, i.e., an optical equalizer. As a result, it is possible to cancel the frequency dependence of the WDM light emitted from the optical multiplexing section.

In a case where the continuous lightwave emitted from the WDM light source is modulated before being combined in the optical combining section in the light source section, then it is possible to produce a copy of the optical signal that has passed through the optical multiplexing section by subjecting it to frequency conversion.

Figure 27:
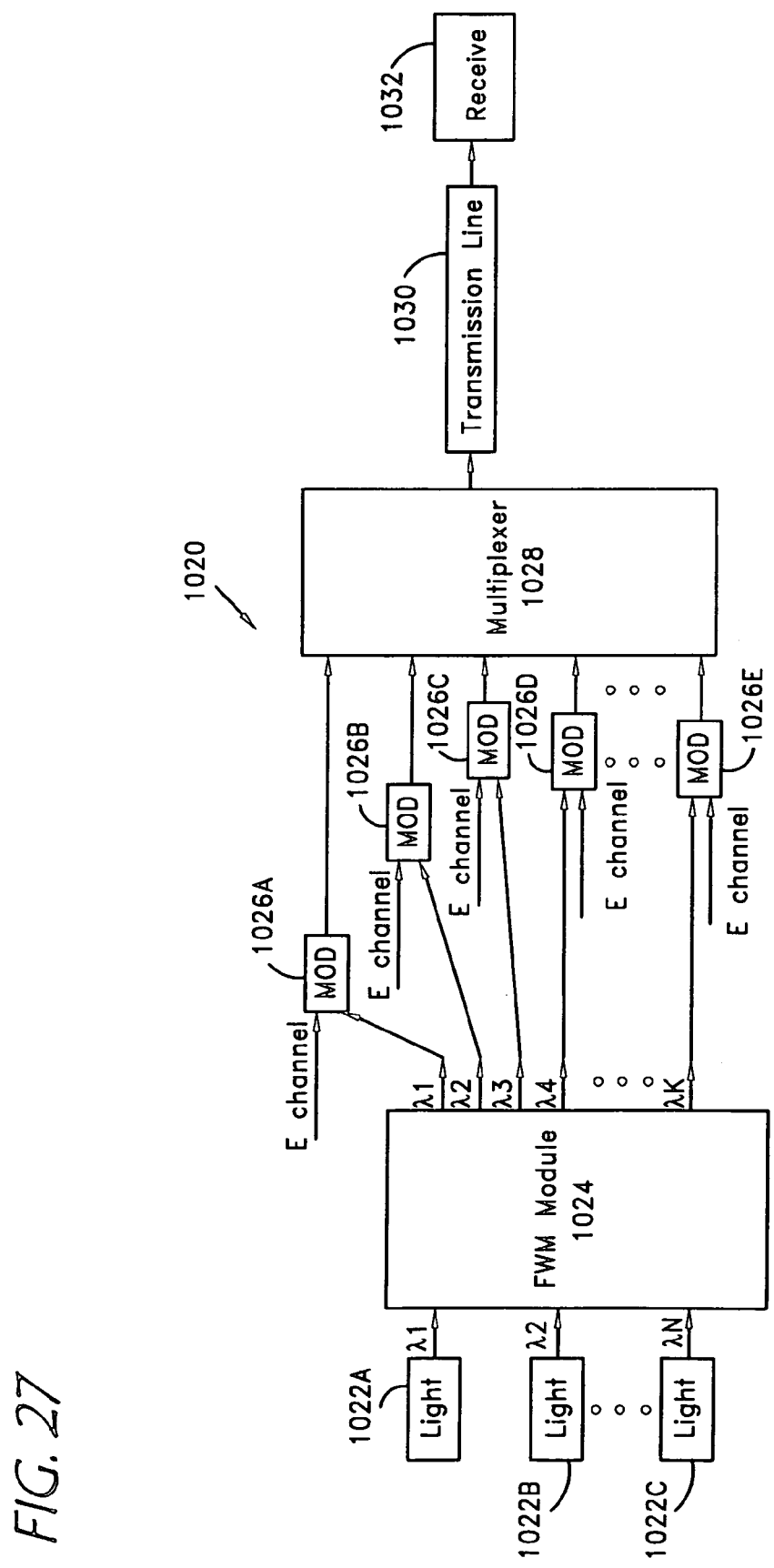
FIG. 27 is a block diagram of a telecommunications system implementing a multi-frequency light source of the invention.

FIG. 27 is a block diagram illustrating an exemplary telecommunications system 1020 wherein the above-described embodiments of the multi-frequency light source can advantageously be implemented. The communications system 1020 comprises multiple (N) light sources 1022A-C, each configured to emit a continuous wave optical signal ($\lambda$), for example light emitting diodes, lasers, etc. The light sources 1022A-C are coupled to a four-wave mixing module 1024 according to the multi-frequency light source of the invention, which uses proper four-wave mixing to produce K optical signals ($\lambda_1$-$\lambda_K$) in response to the N continuous wave optical signals. Each of the continuous wave optical signals ($\lambda_1$-$\lambda_K$) are then modulated with an electrical signal for transmission at a modulator 1026, and the modulated signals are multiplexed in a multiplexer 1028 for transmission as a single, multiplexed optical signal (WDM for example). The multiplexed optical signal is then transmitted over an optical transmission line 1030 to an optical receiver 1032.

For example, if L four-wave mixers according to the previous description are implemented in series in the FWM module 1024, then the FWM module 1024 can provide $N \times 2^L$ optical channels ($K=2^L$). In contrast, if L four-wave mixers according to the previous description are implemented in parallel in the FWM module 1024, then the FWM module 1024 can provide $N \times (L+1)$ optical channels ($K=N \times (L+1)$).

Particularly, in previous light sources for telecommunications system, eight light sources would be needed to provide eight optical signals for transmission of eight electrical channels or signals. Using a light source according to the invention, implementing a series configuration in the FWM module 1024, only four light sources in total (two light sources 1022, and two pump light sources in the FWM module 1024) are needed to produce eight optical signals having different frequencies/wavelengths. Moreover, as the number of optical signals needed for transmission of electrical channels increases, the reduction in the number of light sources needed for a light source of the invention over that of the prior art becomes more impactful. Reducing the number of light source generators in a light source section of a telecommunications system can reduce material or component cost in addition to power consumption.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A telecommunications system, comprising:
   a multi-frequency continuous wave light source configured to emit a continuous wave having a plurality of frequencies, wherein said plurality of frequencies are generated by proper four-wave mixing in a nonlinear medium, said multi-frequency continuous light source including one laser diode coupled to an optical multiplexer;
   a demultiplexer, coupled to said multi-frequency continuous wave light source and configured to demultiplex said continuous wave so as to provide a plurality of lightwaves;
   a plurality of modulators, coupled to said demultiplexer, configured to modulate said plurality of lightwaves so as to provide a plurality of optical signals;
   a multiplexer, coupled to said plurality of modulators and configured to multiplex said plurality of optical signals so as to provide a wavelength division multiplexed optical signal;
   an optical transmission line, coupled to said multiplexer;
   a demultiplexer, coupled to said optical transmission line and configured to demultiplex output signals from said optical transmission line into a plurality of optical signals; and
   an optical receiver, coupled to said optical transmission line, configured to receive said plurality of optical signals.

2. The telecommunications system of claim 1, wherein said multi-frequency continuous wave light source further comprises:
   a pump light source, configured to emit a pump lightwave;
   a multiplexed light source, configured to emit a wavelength division multiplexed (WDM) lightwave having a plurality of lightwaves;
   an optical combiner, coupled to said pump light source and said multiplexed light source and configured to combine said pump lightwave and said WDM lightwave; and
   a nonlinear medium, coupled to said optical combiner and configured to generate four wave mixing so as to generate a plurality of lightwaves having more optical channels than said WDM lightwave.

3. The telecommunications system of claim 2, further comprising an optical filter coupled to an emission end of said nonlinear medium.

4. The telecommunications system of claim 3, wherein said optical filter is configured to filter out said pump lightwave from a plurality of lightwaves emitted from said nonlinear medium.

5. The telecommunications system of claim 3, wherein said optical filter is configured to remove said pump lightwave and said WDM lightwave from a plurality of lightwaves emitted from said nonlinear medium.

6. The telecommunications system of claim 2, wherein the nonlinear medium is an optical fiber.

7. The telecommunications system of claim 2, wherein the nonlinear medium is a semiconductor optical amplifier.

8. The telecommunications system of claim 2, wherein a polarization controller is coupled between said pump light source and said nonlinear medium.

9. The telecommunications system of claim 2, wherein said pump light source and said nonlinear medium are coupled with a polarization maintaining fiber.

10. The telecommunications system of claim 2, wherein said multiplexer and said nonlinear medium are coupled with a polarization maintaining fiber.

11. The telecommunications system of claim 2, wherein said demultiplexer and said nonlinear medium are coupled with a polarization maintaining fiber.

12. The telecommunications system of claim 2, wherein said optical combiner exhibits polarization maintaining characteristics.

13. The telecommunications system of claim 2, further comprising a polarization controller disposed between said pump light source and said optical combiner.

14. The telecommunications system of claim 2, wherein said multiplexed light source comprises at least two laser diodes coupled to an optical multiplexer.

15. The telecommunications system of claim 2, wherein said pump light source comprises at least two laser diodes coupled to an optical multiplexer.

16. The telecommunications system of claim 1, wherein each said modulator and said multiplexer are coupled with a polarization maintaining fiber.

17. The telecommunications system of claim 1, wherein said multi-frequency continuous wave light source and said demultiplexer are coupled with a polarization maintaining fiber.

* * * * *